(12) United States Patent
Miles et al.

(10) Patent No.: US 9,906,869 B2
(45) Date of Patent: Feb. 27, 2018

(54) HINGED MEMS DIAPHRAGM, AND METHOD OF MANUFACTURE THEREOF

(71) Applicant: The Research Foundation for The State University of New York, Binghamton, NY (US)

(72) Inventors: Ronald N. Miles, Newark Valley, NY (US); Weili Cui, Vestal, NY (US)

(73) Assignee: The Research Foundation for the State University of New York, Binghamton, NY (US)

( * ) Notice: Subject to any disclaimer, the term of this patent is extended or adjusted under 35 U.S.C. 154(b) by 0 days.

(21) Appl. No.: 15/411,575

(22) Filed: Jan. 20, 2017

(65) Prior Publication Data
US 2017/0127189 A1    May 4, 2017

Related U.S. Application Data

(60) Continuation of application No. 14/935,771, filed on Nov. 9, 2015, now Pat. No. 9,554,213, which is a
(Continued)

(51) Int. Cl.
*B81B 3/00*     (2006.01)
*H04R 19/04*    (2006.01)

(52) U.S. Cl.
CPC .......... *H04R 19/04* (2013.01); *B81B 3/0027* (2013.01); *B81B 2201/0257* (2013.01);
(Continued)

(58) Field of Classification Search
CPC .............. H04R 19/04; H04R 2201/003; H04R 2307/025; B81B 3/0027; B81B 2203/0127; B81B 2201/0257; B81B 2201/042
See application file for complete search history.

(56) References Cited

U.S. PATENT DOCUMENTS

| 1,663,256 A | 3/1928 | Lindsey et al. |
| 1,749,635 A | 3/1930 | Erwin et al. |

(Continued)

FOREIGN PATENT DOCUMENTS

WO    WO2004016041 A1    2/2004

OTHER PUBLICATIONS

Cornell News: "Super fly lends an ear to bio-inspired hearing aids and robotic listening devices", Cornell neuroscientist report. pp. 1-3 http://www.news.cornell.edu/releases/March01/fly_ear.html.
(Continued)

*Primary Examiner* — Selim Ahmed
(74) *Attorney, Agent, or Firm* — Steven M. Hoffberg; Tully Rinckey PLLC

(57) ABSTRACT

A method of forming a micromechanical structure comprising, forming a sacrificial layer on a surface and walls of a trench in a substrate; depositing a structural layer over the sacrificial layer, extending into the trench, selectively etching the structural layer to define a pattern having a boundary, at least a portion of the structural layer overlying a respective portion of the trench being removed and at least a portion of the structural layer extending into the trench being preserved at the boundary; and removing at least a portion of the sacrificial layer from underneath the structural layer, prior to removal of at least a portion of the sacrificial layer extending into the trench at the structural boundary. A micromechanical structure formed by the method is also provided.

19 Claims, 9 Drawing Sheets

Related U.S. Application Data division of application No. 14/039,149, filed on Sep. 27, 2013, now Pat. No. 9,181,086.

(60) Provisional application No. 61/708,282, filed on Oct. 1, 2012.

(52) U.S. Cl.
CPC . *B81B 2201/042* (2013.01); *B81B 2203/0127* (2013.01); *H04R 2201/003* (2013.01); *H04R 2307/025* (2013.01)

(56) References Cited

U.S. PATENT DOCUMENTS

| | | |
|---|---|---|
| 3,573,400 A | 4/1971 | Sessler et al. |
| 4,403,144 A | 9/1983 | Strahan et al. |
| 4,849,071 A | 7/1989 | Evans et al. |
| 5,146,435 A | 9/1992 | Bernstein |
| 5,161,200 A | 11/1992 | Barr |
| 5,311,360 A | 5/1994 | Bloom et al. |
| 5,359,445 A | 10/1994 | Robertson |
| 5,490,220 A | 2/1996 | Loeppert |
| 5,573,679 A | 11/1996 | Mitchell et al. |
| 5,633,552 A | 5/1997 | Lee et al. |
| 5,652,801 A | 7/1997 | Paddock |
| 5,703,957 A | 12/1997 | McAteer |
| 5,739,945 A | 4/1998 | Tayebati |
| 5,747,705 A | 5/1998 | Herb et al. |
| 5,808,210 A | 9/1998 | Herb et al. |
| 5,835,255 A | 11/1998 | Miles |
| 5,839,062 A | 11/1998 | Nguyen et al. |
| 5,870,482 A | 2/1999 | Loeppert et al. |
| 5,878,147 A | 3/1999 | Killion et al. |
| 5,889,872 A | 3/1999 | Sooriakumar et al. |
| 5,914,507 A | 6/1999 | Polla et al. |
| 5,932,940 A | 8/1999 | Epstein et al. |
| 5,952,974 A | 9/1999 | Ito et al. |
| 5,955,668 A | 9/1999 | Hsu et al. |
| 6,035,714 A | 3/2000 | Yazdi et al. |
| 6,087,638 A | 7/2000 | Silverbrook |
| 6,088,463 A | 7/2000 | Rombach et al. |
| 6,140,689 A | 10/2000 | Scheiter et al. |
| 6,167,757 B1 | 1/2001 | Yazdi et al. |
| 6,180,427 B1 | 1/2001 | Silverbrook |
| 6,188,415 B1 | 2/2001 | Silverbrook |
| 6,209,989 B1 | 4/2001 | Silverbrook |
| 6,217,153 B1 | 4/2001 | Silverbrook |
| 6,227,654 B1 | 5/2001 | Silverbrook |
| 6,235,211 B1 | 5/2001 | Silverbrook |
| 6,238,040 B1 | 5/2001 | Silverbrook |
| 6,243,113 B1 | 6/2001 | Silverbrook |
| 6,245,246 B1 | 6/2001 | Silverbrook |
| 6,245,247 B1 | 6/2001 | Silverbrook |
| 6,247,791 B1 | 6/2001 | Silverbrook |
| 6,254,793 B1 | 7/2001 | Silverbrook |
| 6,257,059 B1 | 7/2001 | Weinberg et al. |
| 6,258,284 B1 | 7/2001 | Silverbrook |
| 6,260,953 B1 | 7/2001 | Silverbrook et al. |
| 6,264,849 B1 | 7/2001 | Silverbrook |
| 6,264,850 B1 | 7/2001 | Silverbrook |
| 6,286,369 B1 | 9/2001 | Yazdi et al. |
| 6,286,935 B1 | 9/2001 | Silverbrook |
| 6,293,653 B1 | 9/2001 | Silverbrook |
| 6,294,101 B1 | 9/2001 | Silverbrook |
| 6,299,300 B1 | 10/2001 | Silverbrook |
| 6,312,107 B1 | 11/2001 | Silverbrook |
| 6,312,615 B1 | 11/2001 | Silverbrook |
| 6,324,192 B1 | 11/2001 | Tayebati |
| 6,336,710 B1 | 1/2002 | Silverbrook |
| 6,340,222 B1 | 1/2002 | Silverbrook |
| 6,382,769 B1 | 5/2002 | Silverbrook |
| 6,392,313 B1 | 5/2002 | Epstein et al. |
| 6,402,968 B1 | 6/2002 | Yazdi et al. |
| 6,416,679 B1 | 7/2002 | Silverbrook |
| 6,472,244 B1 | 10/2002 | Ferrari et al. |
| 6,491,833 B1 | 12/2002 | Silverbrook |
| 6,515,346 B1 | 2/2003 | Kemeny |
| 6,535,460 B2 | 3/2003 | Loeppert et al. |
| 6,567,572 B2 | 5/2003 | Degertekin et al. |
| 6,578,420 B1 | 6/2003 | Hsu |
| 6,597,490 B2 | 7/2003 | Tayebati |
| 6,627,965 B1 | 9/2003 | Tuller et al. |
| 6,650,455 B2 | 11/2003 | Miles |
| 6,664,713 B2 | 12/2003 | Boesen |
| 6,667,189 B1 | 12/2003 | Wang et al. |
| 6,674,562 B1 | 1/2004 | Miles |
| 6,677,176 B2 | 1/2004 | Wong et al. |
| 6,781,231 B2 | 8/2004 | Minervini |
| 6,782,755 B2 | 8/2004 | Tai et al. |
| 6,787,051 B2 | 9/2004 | Silverbrook |
| 6,788,796 B1 | 9/2004 | Miles et al. |
| 6,855,264 B1 | 2/2005 | Silverbrook |
| 6,928,720 B2 | 8/2005 | Kobayashi et al. |
| 6,929,030 B2 | 8/2005 | Unger et al. |
| 6,938,990 B2 | 9/2005 | Silverbrook |
| 6,940,564 B2 | 9/2005 | Murden et al. |
| 6,963,653 B1 | 11/2005 | Miles |
| 6,967,362 B2 | 11/2005 | Nam et al. |
| 6,987,859 B2 | 1/2006 | Loeppert et al. |
| 7,012,732 B2 | 3/2006 | Miles |
| 7,036,372 B2 | 5/2006 | Chojnacki et al. |
| 7,041,225 B2 | 5/2006 | Lutz |
| 7,053,733 B2 | 5/2006 | Yata et al. |
| 7,092,539 B2 | 8/2006 | Sheplak et al. |
| 7,103,196 B2 | 9/2006 | Warren |
| 7,123,216 B1 | 10/2006 | Miles |
| 7,132,307 B2 | 11/2006 | Wang et al. |
| 7,144,750 B2 | 12/2006 | Ouellet et al. |
| 7,146,014 B2 | 12/2006 | Hannah |
| 7,146,016 B2 | 12/2006 | Pedersen |
| 7,161,730 B2 | 1/2007 | Floyd |
| 7,166,910 B2 | 1/2007 | Minervini |
| 7,171,012 B2 | 1/2007 | Izuchi et al. |
| 7,176,545 B2 | 2/2007 | Leedy |
| 7,187,489 B2 | 3/2007 | Miles |
| 7,190,038 B2 | 3/2007 | Dehe et al. |
| 7,192,819 B1 | 3/2007 | Padmanabhan et al. |
| 7,210,767 B2 | 5/2007 | Silverbrook |
| 7,216,671 B2 | 5/2007 | Unger et al. |
| 7,219,982 B2 | 5/2007 | Silverbrook |
| 7,223,696 B2 | 5/2007 | Leedy |
| 7,234,795 B2 | 6/2007 | Silverbrook |
| 7,236,284 B2 | 6/2007 | Miles |
| 7,242,012 B2 | 7/2007 | Leedy |
| 7,242,089 B2 | 7/2007 | Minervini |
| 7,250,128 B2 | 7/2007 | Unger et al. |
| 7,250,315 B2 | 7/2007 | Miles |
| 7,252,366 B2 | 8/2007 | Silverbrook |
| 7,259,865 B2 | 8/2007 | Cummings et al. |
| 7,275,811 B2 | 10/2007 | Silverbrook |
| 7,288,424 B2 | 10/2007 | Hunter et al. |
| 7,289,256 B2 | 10/2007 | Cummings et al. |
| 7,293,855 B2 | 11/2007 | Silverbrook |
| 7,301,212 B1 | 11/2007 | Mian et al. |
| 7,302,157 B2 | 11/2007 | Chui |
| 7,304,784 B2 | 12/2007 | Chui et al. |
| 7,307,020 B2 | 12/2007 | Leedy |
| 7,317,234 B2 | 1/2008 | Marsh et al. |
| 7,318,349 B2 | 1/2008 | Vaganov et al. |
| 7,321,456 B2 | 1/2008 | Cummings |
| 7,327,510 B2 | 2/2008 | Cummings et al. |
| 7,328,975 B2 | 2/2008 | Silverbrook |
| 7,329,933 B2 | 2/2008 | Zhe et al. |
| 7,332,127 B2 | 2/2008 | Kim et al. |
| 7,334,874 B2 | 2/2008 | Silverbrook |
| 7,343,080 B2 | 3/2008 | Gally et al. |
| 7,350,903 B2 | 4/2008 | Silverbrook |
| 7,355,720 B1 | 4/2008 | Carr |
| 7,358,151 B2 | 4/2008 | Araki et al. |
| 7,359,066 B2 | 4/2008 | Cummings et al. |
| 7,360,865 B2 | 4/2008 | Silverbrook |
| 7,360,871 B2 | 4/2008 | Silverbrook |
| 7,360,872 B2 | 4/2008 | Silverbrook |

(56) References Cited

U.S. PATENT DOCUMENTS

| | | |
|---|---|---|
| 7,368,803 B2 | 5/2008 | Gally et al. |
| 7,369,252 B2 | 5/2008 | Cummings et al. |
| 7,372,619 B2 | 5/2008 | Miles |
| 7,379,227 B2 | 5/2008 | Miles |
| 7,381,589 B2 | 6/2008 | Minervini |
| 7,382,515 B2 | 6/2008 | Chung et al. |
| 7,385,744 B2 | 6/2008 | Kogut et al. |
| 7,385,835 B2 | 6/2008 | Leedy |
| 7,387,365 B2 | 6/2008 | Silverbrook |
| 7,388,704 B2 | 6/2008 | Djordjev |
| 7,390,421 B2 | 6/2008 | Silverbrook |
| 7,393,083 B2 | 7/2008 | Silverbrook |
| 7,401,884 B2 | 7/2008 | Silverbrook |
| 7,401,900 B2 | 7/2008 | Silverbrook |
| 7,403,323 B2 | 7/2008 | Cummings et al. |
| 7,405,863 B2 | 7/2008 | Tung et al. |
| 7,405,924 B2 | 7/2008 | Gally et al. |
| 7,410,243 B2 | 8/2008 | Silverbrook |
| 7,410,250 B2 | 8/2008 | Silverbrook |
| 7,415,186 B2 | 8/2008 | Cummings et al. |
| 7,416,280 B2 | 8/2008 | Silverbrook |
| 7,416,282 B2 | 8/2008 | Silverbrook |
| 7,417,735 B2 | 8/2008 | Cummings et al. |
| 7,417,784 B2 | 8/2008 | Sasagawa et al. |
| 7,434,915 B2 | 10/2008 | Silverbrook |
| 7,436,054 B2 | 10/2008 | Zhe |
| 7,439,616 B2 | 10/2008 | Minervini |
| 7,448,728 B2 | 11/2008 | Silverbrook |
| 7,449,356 B2 | 11/2008 | Weigold |
| 7,450,295 B2 | 11/2008 | Tung et al. |
| 7,453,579 B2 | 11/2008 | Kothari et al. |
| 7,459,329 B2 | 12/2008 | Ouellet et al. |
| 7,469,461 B2 | 12/2008 | Chang et al. |
| 7,471,442 B2 | 12/2008 | Sampsell |
| 7,471,798 B2 | 12/2008 | Warren |
| 7,472,984 B2 | 1/2009 | Silverbrook |
| 7,473,572 B2 | 1/2009 | Dehe et al. |
| 7,475,965 B2 | 1/2009 | Silverbrook |
| 7,479,694 B2 | 1/2009 | Leedy |
| 7,483,197 B2 | 1/2009 | Miles |
| 7,485,571 B2 | 2/2009 | Leedy |
| 7,488,051 B2 | 2/2009 | Silverbrook |
| 7,520,173 B2 | 4/2009 | Lee et al. |
| 7,527,357 B2 | 5/2009 | Silverbrook |
| 7,527,995 B2 | 5/2009 | Sampsell |
| 7,527,998 B2 | 5/2009 | Tung et al. |
| 7,532,377 B2 | 5/2009 | Miles |
| 7,534,640 B2 | 5/2009 | Sasagawa et al. |
| 7,537,964 B2 | 5/2009 | Minervini |
| 7,542,580 B2 | 6/2009 | Burns |
| 7,545,945 B2 | 6/2009 | Miles |
| 7,549,731 B2 | 6/2009 | Silverbrook |
| 7,550,805 B2 | 6/2009 | Leedy |
| 7,550,810 B2 | 6/2009 | Mignard et al. |
| 7,553,001 B2 | 6/2009 | Silverbrook |
| 7,553,684 B2 | 6/2009 | Chui et al. |
| 7,554,711 B2 | 6/2009 | Miles |
| 7,554,714 B2 | 6/2009 | Chui et al. |
| 7,564,612 B2 | 7/2009 | Chui |
| 7,564,613 B2 | 7/2009 | Sasagawa et al. |
| 7,566,940 B2 | 7/2009 | Sasagawa et al. |
| 7,567,373 B2 | 7/2009 | Chui et al. |
| 7,569,906 B2 | 8/2009 | Mori et al. |
| 7,570,865 B2 | 8/2009 | Gally et al. |
| 7,578,582 B2 | 8/2009 | Silverbrook |
| 7,582,952 B2 | 9/2009 | Chou |
| 7,591,539 B2 | 9/2009 | Silverbrook |
| 7,615,834 B2 | 11/2009 | Khuri-Yakub et al. |
| 7,615,837 B2 | 11/2009 | Leedy |
| 7,618,831 B2 | 11/2009 | Cummings et al. |
| 7,623,287 B2 | 11/2009 | Sasagawa et al. |
| 7,623,752 B2 | 11/2009 | Gally et al. |
| 7,628,468 B2 | 12/2009 | Silverbrook |
| 7,630,114 B2 | 12/2009 | Wang et al. |
| 7,630,119 B2 | 12/2009 | Tung et al. |
| 7,633,131 B1 | 12/2009 | Padmanabhan et al. |
| 7,635,178 B2 | 12/2009 | Silverbrook |
| 7,636,151 B2 | 12/2009 | Kothari et al. |
| 7,642,575 B2 | 1/2010 | Wong et al. |
| 7,649,671 B2 | 1/2010 | Kothari et al. |
| 7,653,371 B2 | 1/2010 | Floyd |
| 7,658,473 B2 | 2/2010 | Silverbrook |
| 7,661,793 B2 | 2/2010 | Silverbrook |
| 7,669,970 B2 | 3/2010 | Silverbrook |
| 7,669,971 B2 | 3/2010 | Silverbrook |
| 7,670,893 B2 | 3/2010 | Leedy |
| 7,699,440 B2 | 4/2010 | Silverbrook |
| 7,703,890 B2 | 4/2010 | Silverbrook |
| 7,708,372 B2 | 5/2010 | Silverbrook |
| 7,708,381 B2 | 5/2010 | Silverbrook |
| 7,710,629 B2 | 5/2010 | Palmateer |
| 7,711,239 B2 | 5/2010 | Sasagawa et al. |
| 7,712,872 B2 | 5/2010 | Silverbrook |
| 7,717,542 B2 | 5/2010 | Silverbrook |
| 7,719,752 B2 | 5/2010 | Sampsell et al. |
| 7,724,417 B2 | 5/2010 | Lewis et al. |
| 7,731,334 B2 | 6/2010 | Silverbrook |
| 7,731,336 B2 | 6/2010 | Silverbrook |
| 7,753,469 B2 | 7/2010 | Silverbrook |
| 7,753,491 B2 | 7/2010 | Silverbrook |
| 7,754,010 B2 | 7/2010 | Unger et al. |
| 7,758,166 B2 | 7/2010 | Silverbrook |
| 7,763,546 B2 | 7/2010 | Kothari et al. |
| 7,763,948 B2 | 7/2010 | Leedy |
| 7,766,055 B2 | 8/2010 | Unger et al. |
| 7,775,632 B2 | 8/2010 | Silverbrook |
| 7,775,634 B2 | 8/2010 | Silverbrook |
| 7,794,053 B2 | 9/2010 | Silverbrook |
| 7,795,695 B2 | 9/2010 | Weigold et al. |
| 7,808,060 B2 | 10/2010 | Hsiao |
| 7,808,640 B2 | 10/2010 | Fritz et al. |
| 7,812,418 B2 | 10/2010 | Hsu et al. |
| 7,815,290 B2 | 10/2010 | Silverbrook |
| 7,820,469 B2 | 10/2010 | Leedy |
| 7,824,630 B2 | 11/2010 | Kim et al. |
| 7,825,484 B2 | 11/2010 | Martin et al. |
| 7,826,629 B2 | 11/2010 | Miles et al. |
| 7,829,961 B2 | 11/2010 | Hsiao |
| 7,830,586 B2 | 11/2010 | Miles |
| 7,835,061 B2 | 11/2010 | Kogut et al. |
| 7,845,764 B2 | 12/2010 | Silverbrook |
| 7,851,247 B2 | 12/2010 | Shih |
| 7,855,095 B2 | 12/2010 | Miyashita et al. |
| 7,863,079 B2 | 1/2011 | Kothari et al. |
| 7,868,402 B2 | 1/2011 | Huang et al. |
| 7,875,485 B2 | 1/2011 | Sasagawa et al. |
| 7,876,924 B1 | 1/2011 | Miles et al. |
| 7,901,048 B2 | 3/2011 | Silverbrook |
| 7,903,835 B2 | 3/2011 | Miles |
| 7,905,574 B2 | 3/2011 | Silverbrook |
| 7,911,012 B2 | 3/2011 | Leedy |
| 7,916,980 B2 | 3/2011 | Lasiter |
| 7,923,791 B2 | 4/2011 | Huang et al. |
| 7,929,714 B2 | 4/2011 | Bazarjani et al. |
| 7,932,117 B2 | 4/2011 | Ueya |
| 7,933,428 B2 | 4/2011 | Sawada |
| 7,934,797 B2 | 5/2011 | Silverbrook |
| 7,934,808 B2 | 5/2011 | Silverbrook |
| 7,936,031 B2 | 5/2011 | Sampsell et al. |
| 7,936,497 B2 | 5/2011 | Chui et al. |
| 7,959,263 B2 | 6/2011 | Silverbrook |
| 7,980,670 B2 | 7/2011 | Silverbrook |
| 7,992,283 B2 | 8/2011 | Miles |
| 7,992,968 B2 | 8/2011 | Silverbrook |
| 8,005,242 B2 | 8/2011 | Hsu et al. |
| 8,008,736 B2 | 8/2011 | Kothari |
| 8,014,059 B2 | 9/2011 | Miles |
| 8,018,049 B2 | 9/2011 | Minervini |
| 8,029,101 B2 | 10/2011 | Silverbrook |
| 8,029,686 B2 | 10/2011 | Silverbrook et al. |
| 8,031,578 B2 | 10/2011 | Obi et al. |
| 8,041,064 B2 | 10/2011 | Kimura |
| 8,045,733 B2 | 10/2011 | Zhe et al. |
| 8,059,326 B2 | 11/2011 | Miles |

(56) References Cited

U.S. PATENT DOCUMENTS

| | | |
|---|---|---|
| 8,063,458 B2 | 11/2011 | Loeffler et al. |
| 8,071,412 B2 | 12/2011 | Shih |
| 8,072,010 B2 | 12/2011 | Lutz |
| 8,072,036 B2 | 12/2011 | Shih |
| 8,073,167 B2 | 12/2011 | Miles |
| 8,076,737 B2 | 12/2011 | Youngner |
| 8,079,669 B2 | 12/2011 | Silverbrook |
| 8,079,670 B2 | 12/2011 | Silverbrook |
| 8,094,846 B2 | 1/2012 | Hovesten et al. |
| 8,096,642 B2 | 1/2012 | Silverbrook |
| 8,097,926 B2 | 1/2012 | De Graff et al. |
| 8,098,870 B2 | 1/2012 | Kok et al. |
| 8,102,015 B2 | 1/2012 | Gong et al. |
| 8,104,497 B2 | 1/2012 | Unger et al. |
| 8,111,871 B2 | 2/2012 | Zhang et al. |
| 8,114,697 B2 | 2/2012 | Kim et al. |
| 8,114,700 B2 | 2/2012 | Miyashita et al. |
| 8,120,125 B2 | 2/2012 | Sasagawa et al. |
| 8,121,315 B2 | 2/2012 | Song et al. |
| 8,121,331 B2 | 2/2012 | Minervini |
| 8,129,803 B2 | 3/2012 | Martin et al. |
| 8,131,006 B2 | 3/2012 | Martin |
| 8,158,492 B2 | 4/2012 | Liu et al. |
| 8,165,323 B2 | 4/2012 | Zhou |
| 8,169,042 B2 | 5/2012 | Weigold et al. |
| 8,184,845 B2 | 5/2012 | Leidl et al. |
| 8,193,596 B2 | 6/2012 | Lee et al. |
| 8,194,896 B2 | 6/2012 | Hsiao |
| 8,199,963 B2 | 6/2012 | Schrank |
| 8,207,585 B2 | 6/2012 | Schlosser et al. |
| 8,208,662 B2 | 6/2012 | Chen |
| 8,208,671 B2 | 6/2012 | Chen et al. |
| 8,214,999 B2 | 7/2012 | Miles |
| 8,231,608 B2 | 7/2012 | Pang et al. |
| 8,231,609 B2 | 7/2012 | Pang et al. |
| 8,258,591 B2 | 9/2012 | Lee et al. |
| 8,276,254 B2 | 10/2012 | Miles |
| 8,304,846 B2 | 11/2012 | Shih |
| 8,309,386 B2 | 11/2012 | Weigold |
| 8,331,589 B2 | 12/2012 | Wu et al. |
| 8,338,898 B2 | 12/2012 | Schrank et al. |
| 8,344,470 B2 | 1/2013 | Sampsell et al. |
| 8,351,634 B2 | 1/2013 | Khenkin |
| 8,351,635 B2 | 1/2013 | Sun et al. |
| 8,358,004 B2 | 1/2013 | Minervini |
| 8,363,859 B2 | 1/2013 | Chen |
| 8,368,153 B2 | 2/2013 | Huang et al. |
| 8,368,154 B2 | 2/2013 | Trusov et al. |
| 8,374,371 B2 | 2/2013 | Miles |
| 8,375,560 B2 | 2/2013 | Tsai et al. |
| 8,393,714 B2 | 3/2013 | Silverbrook |
| 8,422,702 B2 | 4/2013 | Kim et al. |
| 8,428,286 B2 | 4/2013 | Fueldner et al. |
| 8,436,435 B2 | 5/2013 | Chan et al. |
| 8,438,710 B2 | 5/2013 | Li |
| 8,477,983 B2 | 7/2013 | Weigold et al. |
| 8,486,278 B2 | 7/2013 | Pang et al. |
| 8,503,701 B2 | 8/2013 | Miles et al. |
| 8,519,492 B2 | 8/2013 | Song |
| 8,524,519 B2 | 9/2013 | Wang et al. |
| 8,529,538 B2 | 9/2013 | Pang et al. |
| 8,530,981 B2 | 9/2013 | Huckabee et al. |
| 8,536,666 B2 | 9/2013 | Shih |
| 8,536,667 B2 | 9/2013 | de Graff et al. |
| 8,548,178 B2 | 10/2013 | Miles |
| 8,550,119 B2 | 10/2013 | Unger et al. |
| 8,569,850 B2 | 10/2013 | Kok et al. |
| 8,571,249 B2 | 10/2013 | Wang |
| 8,575,037 B2 | 11/2013 | Friza et al. |
| 8,582,795 B2 | 11/2013 | Miles et al. |
| 8,590,136 B2 | 11/2013 | Yang et al. |
| 8,605,920 B2 | 12/2013 | Kim et al. |
| 8,617,934 B1 | 12/2013 | Minervini |
| 8,617,960 B2 | 12/2013 | Denison et al. |
| 8,618,619 B1 | 12/2013 | Miks et al. |
| 8,623,709 B1 | 1/2014 | Minervini |
| 8,623,710 B1 | 1/2014 | Minervini |
| 8,624,384 B1 | 1/2014 | Minervini |
| 8,624,385 B1 | 1/2014 | Minervini |
| 8,624,386 B1 | 1/2014 | Minervini |
| 8,624,387 B1 | 1/2014 | Minervini |
| 8,629,005 B1 | 1/2014 | Minervini |
| 8,629,011 B2 | 1/2014 | Diamond et al. |
| 8,629,551 B1 | 1/2014 | Minervini |
| 8,629,552 B1 | 1/2014 | Minervini |
| 8,633,064 B1 | 1/2014 | Minervini |
| 8,637,945 B2 | 1/2014 | Reichenbach et al. |
| 8,638,491 B2 | 1/2014 | Kothari |
| 8,652,883 B1 | 2/2014 | Minervini |
| 8,656,958 B2 | 2/2014 | Unger et al. |
| 8,664,733 B2 | 3/2014 | Rombach |
| 8,687,827 B2 | 4/2014 | Chen et al. |
| 8,697,470 B2 | 4/2014 | Wang |
| 8,698,255 B2 | 4/2014 | Reichenbach et al. |
| 8,704,360 B1 | 4/2014 | Minervini |
| 8,713,789 B2 | 5/2014 | Leidl et al. |
| 8,765,530 B1 | 7/2014 | Minervini |
| 8,796,790 B2 | 8/2014 | Yang |
| 8,809,973 B2 | 8/2014 | Theuss |
| 8,816,454 B2 | 8/2014 | Zoellin et al. |
| 8,817,357 B2 | 8/2014 | Tao et al. |
| 8,823,115 B2 | 9/2014 | Inoda et al. |
| 8,824,156 B2 | 9/2014 | Tai et al. |
| 8,824,707 B2 | 9/2014 | Bachman et al. |
| 8,828,771 B2 | 9/2014 | Wang |
| 8,828,773 B2 | 9/2014 | Weigold |
| 8,830,557 B2 | 9/2014 | Sampsell et al. |
| 8,841,738 B2 | 9/2014 | Harney et al. |
| 8,847,289 B2 | 9/2014 | Wang |
| 8,855,337 B2 | 10/2014 | van Lippen et al. |
| 8,860,154 B2 | 10/2014 | Wang |
| 8,865,499 B2 | 10/2014 | Pahl et al. |
| 8,865,500 B2 | 10/2014 | Huang et al. |
| 8,890,265 B2 | 11/2014 | Kuratani |
| 8,901,682 B2 | 12/2014 | Reimann et al. |
| 8,901,683 B2 | 12/2014 | Je |
| 8,928,967 B2 | 1/2015 | Miles |
| 8,963,159 B2 | 2/2015 | Lee et al. |
| 8,964,280 B2 | 2/2015 | Tung et al. |
| 8,971,675 B2 | 3/2015 | Lasiter |
| 9,001,412 B2 | 4/2015 | Chui et al. |
| 9,086,564 B2 | 7/2015 | Chui et al. |
| 9,097,885 B2 | 8/2015 | Kothari |
| 9,107,995 B2 | 8/2015 | Pang et al. |
| 9,110,289 B2 | 8/2015 | Miles |
| 9,113,249 B2 | 8/2015 | Miles et al. |
| 9,134,527 B2 | 9/2015 | Lee et al. |
| 9,162,024 B2 | 10/2015 | Pang et al. |
| 9,181,086 B1 | 11/2015 | Miles et al. |
| 2002/0039463 A1 | 4/2002 | Degertekin et al. |
| 2002/0053242 A1 | 5/2002 | Tai et al. |
| 2002/0118850 A1 | 8/2002 | Yeh et al. |
| 2002/0127760 A1 | 9/2002 | Yeh et al. |
| 2002/0135708 A1 | 9/2002 | Murden et al. |
| 2002/0144738 A1 | 10/2002 | Unger et al. |
| 2002/0149070 A1 | 10/2002 | Sheplak et al. |
| 2002/0151100 A1 | 10/2002 | Coffa et al. |
| 2002/0164043 A1 | 11/2002 | Paritsky et al. |
| 2002/0189352 A1 | 12/2002 | Reeds et al. |
| 2003/0002129 A1 | 1/2003 | Kobayashi et al. |
| 2003/0016839 A1 | 1/2003 | Loeppert et al. |
| 2003/0027344 A1 | 2/2003 | Kim et al. |
| 2003/0071012 A1 | 4/2003 | Silverbrook |
| 2003/0103638 A1 | 6/2003 | Boesen |
| 2003/0108274 A1 | 6/2003 | Haronian |
| 2003/0137021 A1 | 7/2003 | Wong et al. |
| 2003/0209669 A1 | 11/2003 | Chou |
| 2003/0210300 A1 | 11/2003 | Silverbrook |
| 2004/0008237 A1 | 1/2004 | Silverbrook |
| 2004/0100518 A1 | 5/2004 | Silverbrook |
| 2004/0106221 A1 | 6/2004 | Hunter et al. |
| 2004/0113153 A1 | 6/2004 | Wong et al. |
| 2004/0130728 A1 | 7/2004 | Degertekin et al. |
| 2004/0218194 A1 | 11/2004 | Silverbrook |

(56) References Cited

U.S. PATENT DOCUMENTS

| | | |
|---|---|---|
| 2004/0231420 A1 | 11/2004 | Xie et al. |
| 2004/0239728 A1 | 12/2004 | Silverbrook |
| 2004/0246311 A1 | 12/2004 | Silverbrook |
| 2004/0259286 A1 | 12/2004 | Dehe et al. |
| 2005/0018015 A1 | 1/2005 | Silverbrook |
| 2005/0018016 A1 | 1/2005 | Silverbrook |
| 2005/0018017 A1 | 1/2005 | Silverbrook |
| 2005/0024434 A1 | 2/2005 | Silverbrook |
| 2005/0024435 A1 | 2/2005 | Silverbrook |
| 2005/0024436 A1 | 2/2005 | Silverbrook |
| 2005/0024437 A1 | 2/2005 | Silverbrook |
| 2005/0024443 A1 | 2/2005 | Silverbrook |
| 2005/0030338 A1 | 2/2005 | Silverbrook |
| 2005/0030339 A1 | 2/2005 | Silverbrook |
| 2005/0030342 A1 | 2/2005 | Silverbrook |
| 2005/0041055 A1 | 2/2005 | Silverbrook |
| 2005/0046663 A1 | 3/2005 | Silverbrook |
| 2005/0046673 A1 | 3/2005 | Silverbrook |
| 2005/0051910 A1 | 3/2005 | Goto et al. |
| 2005/0052514 A1 | 3/2005 | Silverbrook |
| 2005/0052724 A1 | 3/2005 | Suzuki et al. |
| 2005/0072231 A1 | 4/2005 | Chojnacki et al. |
| 2005/0104922 A1 | 5/2005 | Silverbrook |
| 2005/0109107 A1 | 5/2005 | Park |
| 2005/0145599 A1 | 7/2005 | Silverbrook |
| 2005/0146552 A1 | 7/2005 | Silverbrook |
| 2005/0157081 A1 | 7/2005 | Silverbrook |
| 2005/0157082 A1 | 7/2005 | Silverbrook |
| 2005/0168532 A1 | 8/2005 | Silverbrook |
| 2005/0168533 A1 | 8/2005 | Silverbrook |
| 2005/0179733 A1 | 8/2005 | Silverbrook |
| 2005/0206677 A1 | 9/2005 | Silverbrook |
| 2005/0225606 A1 | 10/2005 | Silverbrook |
| 2005/0233492 A1 | 10/2005 | Ouellet et al. |
| 2005/0264612 A1 | 12/2005 | Silverbrook |
| 2006/0008098 A1 | 1/2006 | Tu |
| 2006/0054228 A1 | 3/2006 | Unger et al. |
| 2006/0110895 A1 | 5/2006 | Ouellet et al. |
| 2006/0134904 A1 | 6/2006 | Araki et al. |
| 2006/0140431 A1 | 6/2006 | Zurek |
| 2006/0141656 A1 | 6/2006 | Dehe et al. |
| 2006/0237806 A1 | 10/2006 | Martin et al. |
| 2006/0280319 A1 | 12/2006 | Wang et al. |
| 2006/0284927 A1 | 12/2006 | Silverbrook |
| 2006/0290741 A1 | 12/2006 | Silverbrook |
| 2007/0019280 A1 | 1/2007 | Sasagawa et al. |
| 2007/0047900 A1 | 3/2007 | Sampsell et al. |
| 2007/0065968 A1 | 3/2007 | Kok et al. |
| 2007/0082421 A1 | 4/2007 | Minervini |
| 2007/0087466 A1 | 4/2007 | Weigold et al. |
| 2007/0092983 A1 | 4/2007 | Weigold |
| 2007/0120891 A9 | 5/2007 | Silverbrook |
| 2007/0134839 A1 | 6/2007 | Chang et al. |
| 2007/0188556 A1 | 8/2007 | Silverbrook |
| 2007/0202627 A1 | 8/2007 | Minervini |
| 2007/0205492 A1 | 9/2007 | Wang |
| 2007/0215964 A1 | 9/2007 | Khuri-Yakub et al. |
| 2007/0268327 A9 | 11/2007 | Silverbrook |
| 2007/0272992 A1 | 11/2007 | Mori et al. |
| 2007/0284682 A1 | 12/2007 | Laming et al. |
| 2007/0291070 A9 | 12/2007 | Silverbrook |
| 2007/0291091 A9 | 12/2007 | Silverbrook |
| 2007/0296765 A9 | 12/2007 | Silverbrook |
| 2007/0297631 A1 | 12/2007 | Miles |
| 2008/0024556 A9 | 1/2008 | Silverbrook |
| 2008/0083960 A1 | 4/2008 | Chen et al. |
| 2008/0099860 A1 | 5/2008 | Wuertz |
| 2008/0117258 A1 | 5/2008 | Silverbrook |
| 2008/0121947 A1 | 5/2008 | Frahm et al. |
| 2008/0139409 A1 | 6/2008 | Kim et al. |
| 2008/0152171 A1 | 6/2008 | Hovesten et al. |
| 2008/0157129 A1 | 7/2008 | Hsu et al. |
| 2008/0157238 A1 | 7/2008 | Hsiao |
| 2008/0158301 A1 | 7/2008 | Silverbrook |
| 2008/0158306 A1 | 7/2008 | Silverbrook |
| 2008/0164545 A1 | 7/2008 | Hsiao |
| 2008/0165226 A1 | 7/2008 | Silverbrook |
| 2008/0174638 A1 | 7/2008 | Silverbrook |
| 2008/0185669 A1 | 8/2008 | Kok et al. |
| 2008/0204518 A1 | 8/2008 | Silverbrook |
| 2008/0204519 A1 | 8/2008 | Silverbrook |
| 2008/0232615 A1 | 9/2008 | Song et al. |
| 2008/0252691 A9 | 10/2008 | Silverbrook |
| 2008/0252696 A1 | 10/2008 | Silverbrook |
| 2008/0277007 A1 | 11/2008 | Unger et al. |
| 2008/0283942 A1 | 11/2008 | Huang et al. |
| 2008/0283943 A1 | 11/2008 | Dekker et al. |
| 2008/0283988 A1 | 11/2008 | Huang et al. |
| 2008/0289710 A1 | 11/2008 | Unger et al. |
| 2008/0303851 A1 | 12/2008 | Silverbrook |
| 2008/0303867 A1 | 12/2008 | Silverbrook |
| 2008/0309712 A1 | 12/2008 | Silverbrook |
| 2008/0309713 A1 | 12/2008 | Silverbrook |
| 2008/0309714 A1 | 12/2008 | Silverbrook |
| 2008/0309723 A1 | 12/2008 | Silverbrook |
| 2008/0309724 A1 | 12/2008 | Silverbrook |
| 2008/0309725 A1 | 12/2008 | Silverbrook |
| 2008/0309726 A1 | 12/2008 | Silverbrook |
| 2008/0309727 A1 | 12/2008 | Silverbrook |
| 2008/0316263 A1 | 12/2008 | Silverbrook |
| 2008/0316264 A1 | 12/2008 | Silverbrook |
| 2008/0316265 A1 | 12/2008 | Silverbrook |
| 2008/0316266 A1 | 12/2008 | Silverbrook |
| 2008/0316267 A1 | 12/2008 | Silverbrook |
| 2008/0316268 A1 | 12/2008 | Silverbrook |
| 2009/0014819 A1 | 1/2009 | Loeffler et al. |
| 2009/0015636 A1 | 1/2009 | Silverbrook |
| 2009/0027448 A1 | 1/2009 | Silverbrook |
| 2009/0029501 A1 | 1/2009 | Weigold |
| 2009/0041270 A1 | 2/2009 | Schrank et al. |
| 2009/0046127 A1 | 2/2009 | Silverbrook |
| 2009/0073240 A1 | 3/2009 | Silverbrook |
| 2009/0091601 A1 | 4/2009 | Silverbrook |
| 2009/0091603 A1 | 4/2009 | Silverbrook |
| 2009/0122116 A1 | 5/2009 | Silverbrook |
| 2009/0124029 A1 | 5/2009 | Silverbrook |
| 2009/0128604 A1 | 5/2009 | Silverbrook |
| 2009/0129612 A1 | 5/2009 | Takeuchi et al. |
| 2009/0130783 A1 | 5/2009 | Miyashita et al. |
| 2009/0147636 A1 | 6/2009 | Obi et al. |
| 2009/0153619 A1 | 6/2009 | Silverbrook |
| 2009/0160910 A1 | 6/2009 | Silverbrook |
| 2009/0179233 A1 | 7/2009 | Lee et al. |
| 2009/0180647 A1 | 7/2009 | Chen et al. |
| 2009/0185007 A1 | 7/2009 | Silverbrook |
| 2009/0189953 A1 | 7/2009 | Silverbrook |
| 2009/0202089 A1 | 8/2009 | Zhang et al. |
| 2009/0232336 A1 | 9/2009 | Pahl |
| 2009/0237456 A1 | 9/2009 | Silverbrook |
| 2009/0237460 A1 | 9/2009 | Silverbrook |
| 2009/0243058 A1 | 10/2009 | Shirasaka |
| 2009/0243060 A1 | 10/2009 | Saitoh |
| 2009/0262958 A1 | 10/2009 | Miles |
| 2009/0268926 A1 | 10/2009 | Watanabe |
| 2009/0278897 A1 | 11/2009 | Silverbrook |
| 2010/0019336 A1 | 1/2010 | Sasagawa et al. |
| 2010/0052082 A1 | 3/2010 | Lee et al. |
| 2010/0065931 A1 | 3/2010 | Shih |
| 2010/0085402 A1 | 4/2010 | Silverbrook |
| 2010/0096711 A1 | 4/2010 | Tian |
| 2010/0155863 A1 | 6/2010 | Weekamp |
| 2010/0155864 A1 | 6/2010 | Laming et al. |
| 2010/0158281 A1 | 6/2010 | Lee et al. |
| 2010/0164025 A1 | 7/2010 | Yang |
| 2010/0193885 A1 | 8/2010 | Choo et al. |
| 2010/0201750 A1 | 8/2010 | Silverbrook |
| 2010/0208000 A1 | 8/2010 | Silverbrook |
| 2010/0214367 A1 | 8/2010 | Silverbrook |
| 2010/0265680 A1 | 10/2010 | Tai et al. |
| 2010/0270631 A1 | 10/2010 | Renner |
| 2010/0276767 A1 | 11/2010 | Liu et al. |
| 2010/0285628 A1 | 11/2010 | Martin et al. |
| 2010/0289097 A1 | 11/2010 | Weigold et al. |
| 2011/0013787 A1 | 1/2011 | Chang |

(56) References Cited

U.S. PATENT DOCUMENTS

| | | |
|---|---|---|
| 2011/0024851 A1 | 2/2011 | Shih |
| 2011/0026367 A1 | 2/2011 | Noelle |
| 2011/0027929 A1 | 2/2011 | Shih |
| 2011/0038493 A1 | 2/2011 | Li |
| 2011/0045616 A1 | 2/2011 | Miyashita et al. |
| 2011/0050807 A1 | 3/2011 | Silverbrook |
| 2011/0068880 A1 | 3/2011 | Ho |
| 2011/0073967 A1 | 3/2011 | Chen et al. |
| 2011/0075875 A1 | 3/2011 | Nu et al. |
| 2011/0109700 A1 | 5/2011 | Silverbrook |
| 2011/0115762 A1 | 5/2011 | Sasagawa et al. |
| 2011/0127623 A1 | 6/2011 | Fueldner et al. |
| 2011/0156176 A1 | 6/2011 | Huckabee et al. |
| 2011/0156179 A1 | 6/2011 | Shih |
| 2011/0158439 A1 | 6/2011 | Denison et al. |
| 2011/0165720 A1 | 7/2011 | Weigold |
| 2011/0189804 A1 | 8/2011 | Huang et al. |
| 2011/0198714 A1 | 8/2011 | Yang |
| 2011/0205197 A1 | 8/2011 | Sampsell et al. |
| 2011/0210409 A1 | 9/2011 | Minervini |
| 2011/0222717 A1 | 9/2011 | Kuratani et al. |
| 2011/0233692 A1 | 9/2011 | Inoda et al. |
| 2011/0248364 A1 | 10/2011 | Huang et al. |
| 2011/0266641 A1 | 11/2011 | Song |
| 2011/0272769 A1 | 11/2011 | Song et al. |
| 2011/0311081 A1 | 12/2011 | Kim |
| 2011/0316100 A1 | 12/2011 | Kim et al. |
| 2012/0007924 A1 | 1/2012 | Silverbrook |
| 2012/0025334 A1 | 2/2012 | Chan et al. |
| 2012/0032286 A1 | 2/2012 | Trusov et al. |
| 2012/0033832 A1 | 2/2012 | van Lippen et al. |
| 2012/0043629 A1 | 2/2012 | Minervini |
| 2012/0056952 A1 | 3/2012 | Silverbrook |
| 2012/0087521 A1 | 4/2012 | Delaus et al. |
| 2012/0091544 A1 | 4/2012 | Reichenbach et al. |
| 2012/0091545 A1 | 4/2012 | Reichenbach et al. |
| 2012/0091546 A1 | 4/2012 | Langereis et al. |
| 2012/0092420 A1 | 4/2012 | Silverbrook |
| 2012/0139066 A1 | 6/2012 | Je et al. |
| 2012/0146163 A1 | 6/2012 | Ho et al. |
| 2012/0161257 A1 | 6/2012 | Friza et al. |
| 2012/0189143 A1 | 7/2012 | Buhmann et al. |
| 2012/0193735 A1 | 8/2012 | Chen |
| 2012/0205755 A1 | 8/2012 | Yueh |
| 2012/0237073 A1 | 9/2012 | Goida et al. |
| 2012/0250910 A1 | 10/2012 | Shajaan et al. |
| 2012/0261775 A1 | 10/2012 | Wang et al. |
| 2012/0319174 A1 | 12/2012 | Wang |
| 2012/0319219 A1 | 12/2012 | Diamond et al. |
| 2012/0326249 A1 | 12/2012 | Rombach |
| 2013/0010990 A1 | 1/2013 | Sridharan et al. |
| 2013/0050290 A1 | 2/2013 | Andersson et al. |
| 2013/0056840 A1 | 3/2013 | Bominaar-Silkens et al. |
| 2013/0059409 A1 | 3/2013 | Wang |
| 2013/0065344 A1 | 3/2013 | Weigold |
| 2013/0069179 A1 | 3/2013 | Ishimoto et al. |
| 2013/0075835 A1 | 3/2013 | Chen et al. |
| 2013/0088941 A1 | 4/2013 | Elian et al. |
| 2013/0126990 A1 | 5/2013 | Wang |
| 2013/0140656 A1 | 6/2013 | Pahl et al. |
| 2013/0221456 A1 | 8/2013 | Li et al. |
| 2013/0233086 A1 | 9/2013 | Besling et al. |
| 2013/0244365 A1 | 9/2013 | Kim et al. |
| 2013/0320465 A1 | 12/2013 | Huang et al. |
| 2014/0001581 A1 | 1/2014 | Liu |
| 2014/0008740 A1 | 1/2014 | Wang et al. |
| 2014/0011313 A1 | 1/2014 | Huckabee et al. |
| 2014/0038335 A1 | 2/2014 | Merassi et al. |
| 2014/0070383 A1 | 3/2014 | Goida |
| 2014/0084394 A1 | 3/2014 | Je |
| 2014/0091406 A1 | 4/2014 | Harney et al. |
| 2014/0103464 A1 | 4/2014 | Bologna et al. |
| 2014/0117473 A1 | 5/2014 | Kierse et al. |
| 2014/0145276 A1 | 5/2014 | Rombach |
| 2014/0175572 A1 | 6/2014 | Hsu et al. |
| 2014/0203380 A1 | 7/2014 | Theuss |
| 2014/0239352 A1 | 8/2014 | Wang |
| 2014/0264650 A1 | 9/2014 | Liu et al. |
| 2014/0264653 A1 | 9/2014 | Cheng et al. |
| 2014/0264654 A1 | 9/2014 | Salmon |
| 2014/0264662 A1 | 9/2014 | Cheng et al. |
| 2014/0268273 A1 | 9/2014 | Brosnihan et al. |
| 2014/0268274 A1 | 9/2014 | Brosnihan et al. |
| 2014/0268275 A1 | 9/2014 | Brosnihan et al. |
| 2014/0312439 A1 | 10/2014 | Hoegerl et al. |
| 2014/0332912 A1 | 11/2014 | Theuss |
| 2014/0339657 A1 | 11/2014 | Grosh et al. |
| 2014/0346620 A1 | 11/2014 | Johansen et al. |
| 2015/0088102 A1 | 3/2015 | Fine et al. |
| 2015/0266723 A1 | 9/2015 | Chan et al. |

OTHER PUBLICATIONS

C. Gibbons and R. Miles, Proceedings of IMECE: "Design of Biomimetic directional microphone diaphragm" (Nov. 5-10, 2000), pp. 1-7.

R. Miles, T. Tieu, D. Robert, and R. Hoy, World Scientific: "A mechanical analysis of the novel ear of the parasitoid fly Ormia ochracea" (1997) pp. 1-7.

Chan, Chun-Kai, et al. "Design and implementation of a capacitive-type microphone with rigid diaphragm and flexible spring using the two poly silicon micromachining processes." Sensors Journal, IEEE 11.10 (2011): 2365-2371.

Fedder, Gary K. "MEMS fabrication." 2013 IEEE International Test Conference (ITC). IEEE Computer Society, 2003.

Cul, Weili, Ronald N. Miles, and Quang Su. "A robust miniature silicon microphone diaphragm." IFSA, Sensors & Transducers Journal (ISSN 1726-5479) 7 (2009): 63-77.

Nguyen, Clark T. "Micromachining technologies for miniaturized communication devices." Micromachining and Microfabrication. International Society for Optics and Photonics, 1998.

Gorecki, C. "Recent advances in silicon guided-wave MOEMS: from technology to applications." Optoelectronics Review 3 (2001): 248-256.

Cattin, Davide. Design, modelling and control of IRST capacitive MEMS microphone. Diss. University of Trento, 2009.

Maharbiz, Michel M., Christopher L. Muhlstein, and Olav Solgaard. "Micro and Nano Electromechanical Systems Chapter Editor: Roger T. Howe, Stanford, rthowe@ stanford. edu." (2006).

Logan, Andrew Stephan. The Design, Fabrication and Characterization of Capacitive Micromachined Ultrasonic Transducers for Imaging Applications Diss. University of Waterloo, 2010.

Jeelani, Mohammad Kamran. "Integration and characterization of micromachined optical microphones." (2009). Georgia Institute of Technology.

Ohji, Hiroshi. Macroporous silicon based micromachining. TU Delft, Delft University of Technology, 2002.

Scheeper, P. R., et al. "A review of silicon microphones." Sensors and Actuators A: Physical 44.1 (1994): 1-11.

Fuller, Dr Lynn. "Microelectromechanical Systems (MEMS) Applications—Microphones." Rochester Institute of Technology Microelectronic Engineering (2005): 1-43.

Ning, Y. B., A. W. Mitchell, and R. N. Tait. "Fabrication of a silicon micromachined capacitive microphone using a dry-etch process." Sensors and Actuators A: Physical 53.1 (1996): 237-242.

Pedersen, Michael, Wouter Olthuis, and Piet Bergveld. "A Silicon Condenser microphone with polyimide diaphragm and backplate." Sensors and Actuators A: Physical 63.2 (1997): 97-104.

Shen, Jing, et al. "Single-chip condenser miniature microphone with a high sensitive circular corrugated diaphragm." . Micro Electra Mechanical Systems, 2002. The Fifteenth IEEE International Conference on. IEEE, 2002.

Dehe, Alfons, et al. "Silicon micromachined microphone chip at Siemens." 137th Regular Meeting of the Acoustical Society of America. 1999.

K. Yoo, C. Gibbons, Q. Su, R. Miles, and N. Tien, "Fabrication of biomimetic 3-D structured diaphragms", Sensors and Actuators

(56) References Cited

OTHER PUBLICATIONS

A—Physical 97-8, 448-456 (2002), Transducers 2001 Conference/Eurosensor XVth Conference, Munich, Germany, Jun. 10-14, 2001.
L. Tan, R. Miles, M. Weinstein, R. Miller, Q. Su, W. Cui, and J. Gao, "Response of a biologically inspired MEMS differential microphone diaphragm", in Unattended Ground Sensor Technologies and Applications IV, edited by Carapezza, EM, vol. 4743 of Proceedings of the Society of Photo-Optical Instrumentation Engineers (SPIE), 91-98 (2002), Conference on Unattended Ground Sensor Technologies and Applications IV, Orlando, FL, Apr. 2-5, 2002.
R. Miles and R. Hoy, "The development of a biologically-inspired directional microphone for hearing aids", Audiology and Neuro-Otology 11, 86-94 (2006).
W. Cui, B. Bicen, N. Hall, S. Jones, F. Degertekin, and R. Miles, "Optical sensing in a directional MEMS microphone inspired by the ears of the parasitoid fly, Ormia ochracea", in MEMS 2006: 19th IEEE International Conference on Micro Electro Mechanical Systems, Technical Digest, Proceedings: IEEE Micro Electro Mechanical Systems Workshop, 614-617 (2006), 19th IEEE International Conference on Micro Electra Mechanical Systems (MEMS 2006), Istanbul, Turkey, Jan. 22-26, 2006.
Cui, W. (2004). "Analysis, Desgin, and Fabrication of a Novel Silicon Microphone," Ph.D. Thesis, SUNY at Binghampton.
W. Cui, R. N. Miles, Q. Su, "A Robust Miniature Silicon Microphone diaphragm," IFSA, Sensors & Transducers Journal (ISSN 1726-5479), vol. 7, Special Issue "MEMS: From Micro Devices to Wireless Systems", Oct. 2009, pp. 63-77.

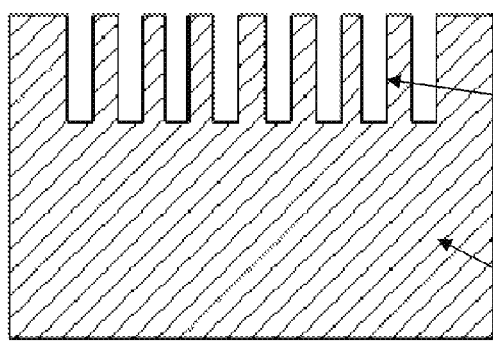
Fig. 3A Reactive Ion Etch
Prior Art
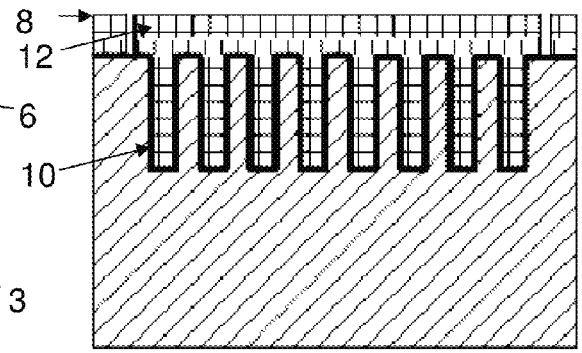
Fig. 3D Polysilicon
Smoothing and Patterning
Prior Art
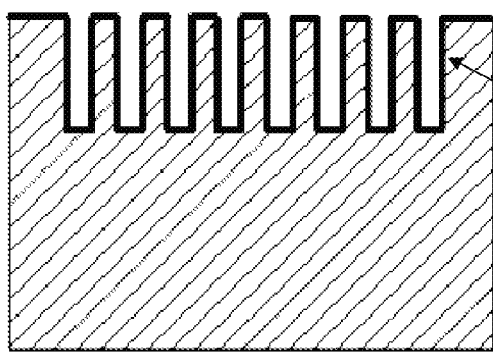
Fig. 3B Sacrificial Oxide Growth
Prior Art
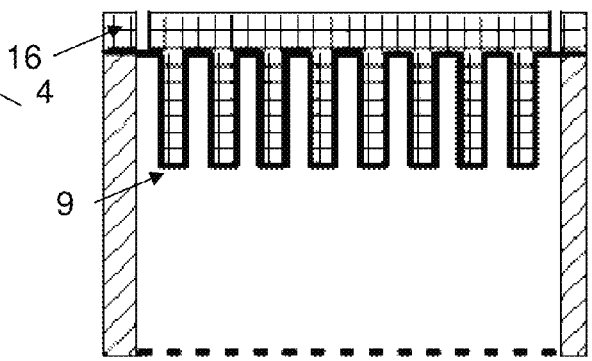
Fig. 3E Deep Reactive Ion Etch
Prior Art
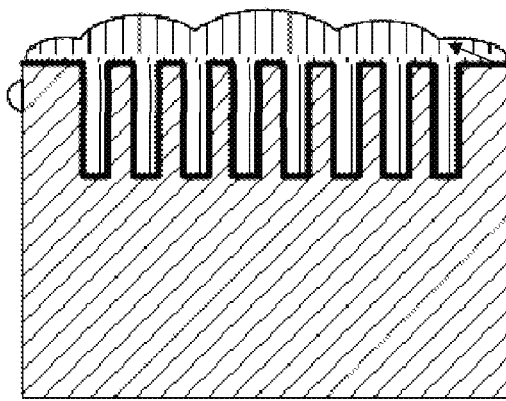
Fig. 3C Polysilicon Deposition
Prior Art
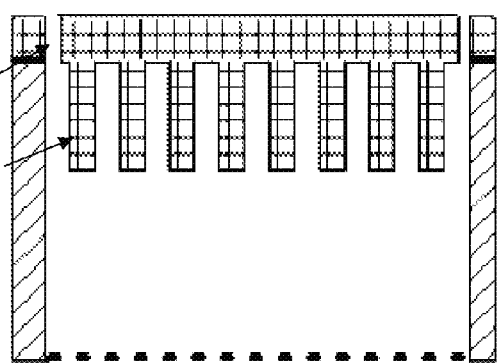
Fig. 3F Buffered
Hydrofluoric Acid Release
Prior Art

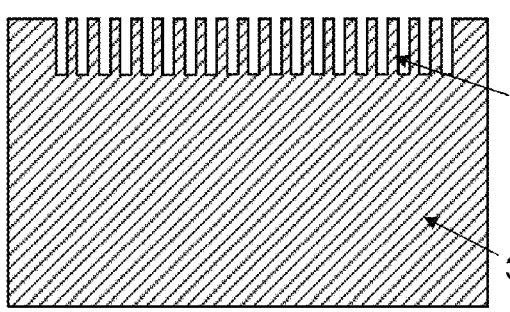
Fig. 6A Trench Etching
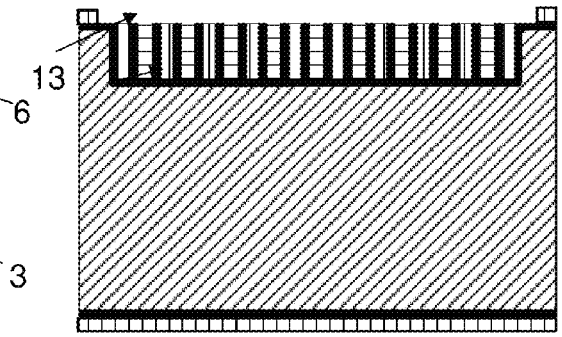
Fig. 6D Polysilicon Patterning
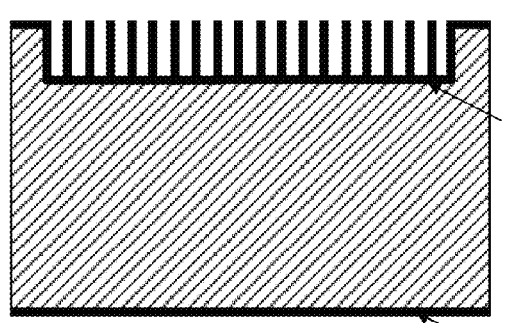
Fig. 6B Trench Oxidation
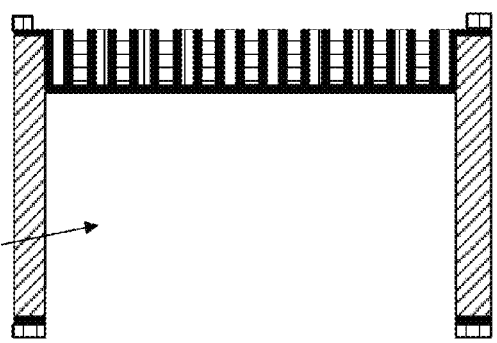
Fig. 6E Backside Etching
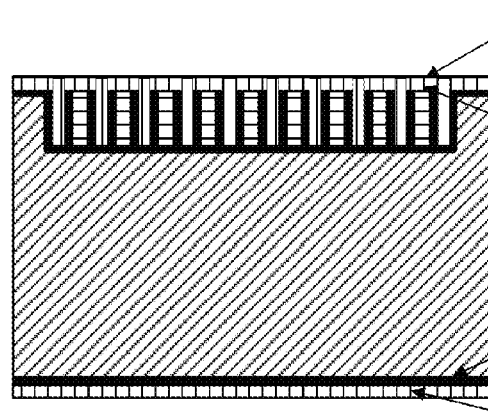
Fig. 6C Polysilicon Deposition
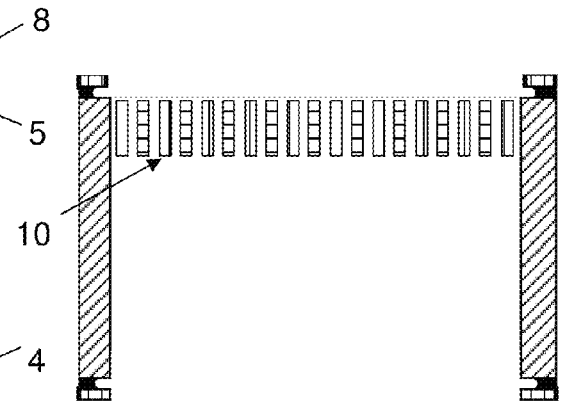
Fig. 6F Buffered Hydrofluoric Acid Release

HINGED MEMS DIAPHRAGM, AND METHOD OF MANUFACTURE THEREOF

CROSS REFERENCE TO RELATED APPLICATION

The present application is a Continuation of U.S. patent application Ser. No. 14/935,771, filed Nov. 9, 2015, now U.S. Pat. No. 9,554,213, issued Jan. 24, 2017, which is a Division of U.S. patent application Ser. No. 14/039,149, filed Sep. 27, 2013, now U.S. Pat. No. 9,181,086, issued Nov. 10, 2015, which is a non-provisional of, and claims benefit of priority from, U.S. Provisional Patent Application Ser. No. 61/708,282, filed Oct. 1, 2012, the entirety of which are expressly incorporated herein by reference.

STATEMENT OF FEDERAL SUPPORT

This invention was made with government support under awards R01 DC009859 and R01 DC009429 awarded by the National Institutes of Health. The government has certain rights in this invention.

FIELD OF THE INVENTION

The present invention relates to the field of micro-electro-mechanical system (MEMS) devices.

BACKGROUND OF THE INVENTION

Over the past twenty years researchers have created a nearly uncountable number of MEMS sensors and actuated structures using the tools of microfabrication. The scientific and engineering literature contains many examples of high-performance devices. There are, however, various barriers to manufacturing successful designs. While the fabrication methods MEMS designers have inherited from the microelectronics industry permit the construction of remarkably detailed and complex moving structures, fabrication-induced stresses and resulting fractures often result in a very poor yield.

One type of device which can be produced using micro-electro-mechanical systems (MEMS) technology is a microphone. Microphones can be omnidirectional, meaning that the microphone is responsive to the dynamically changing pressure incident on the diaphragm from all directions, or directional, meaning that the microphone is selectively sensitive to sound waves of particular propagation axes.

The advantages of MEMS microphones over electret condenser microphones (ECMs) are their size, performance, sound quality and suitability for mass production. The advantages of a microphone according to this design are its small size, low internal noise, low power consumption and high directionality. All of these features have been demonstrated during evaluation of a prototype and confirm its superior performance over existing commercially available MEMS directional microphones [7].

A particular type of directional microphone provides a "counterbalanced" diaphragm in which two adjacent portions, separated by a central pivot axis, are exposed to sound. The pivoting diaphragm is selectively responsive to acoustic waves depending on the inclination of the acoustic wave with respect to the plane of the diaphragm and pivot axis. This type of directional microphone is inspired by the acoustic sensory organ of Ormia ochracea [42].

The pivoting diaphragm itself requires a rotating support, which concentrates stress at the pivoting support. The basic design of such a directional microphone is shown in FIGS. 1A and 1B. These MEMS sensors are used, for example, to construct biomimetic directional microphones for hearing aid applications [1-13].

The fabrication of parallel plate electrodes is a common way to achieve capacitive sensing for microphones and other planar displacement sensors, and may be accomplished by depositing a sacrificial oxide film (typically having a thickness in the range of 5 to 10 microns) and then depositing a conductive material, such as silicon or metal, on top of the oxide. The space between the conducting electrode and the moving diaphragm may then be opened through a release etch, creating a diaphragm membrane which floats over a backplate, supported by a pair of opposed hinges. A disadvantage of employing parallel plate sensing is that the air between the diaphragm and the fixed electrode is squeezed as the diaphragm moves and must flow in the plane of the diaphragm. The viscous force due to the flow of air depends on the third power of the distance between the diaphragm and the stationary electrode, and can be a dominant source of damping in the system [19-26]. It is, of course, desirable to have this gap be as small as feasible to increase the amount of capacitance and the overall sensitivity of the device. While holes in the electrode can be designed to reduce the damping, it can be very difficult to design a system that has both high sensitivity and low damping, which is desired in a device that must move quickly.

An additional substantial difficulty with the use of parallel plate electrodes is that the bias voltage that is required between the electrode and the diaphragm results in an attractive force that compels the two surfaces to reduce the size of the gap. If the mechanical restoring force provided by the hinge is not sufficiently high, the use of too large of a bias voltage will cause the gap between the diaphragm and electrode to collapse completely, with the rear of the diaphragm contacting the backplate.

The use of interdigitated fingers at the periphery of the diaphragm can overcome many of the disadvantages of parallel plate electrodes, and can be fabricated in the same steps and mask as used to create the slits around the diaphragm.

While the use of interdigitated fingers solves many difficult problems inherent in parallel plate MEMS devices, there are practical difficulties that have greatly impeded their use. The main difficulties are that the capacitance that can be achieved is lower than desired, due to the small surface area of the interdigitated fingers and therefore small change in charge to the movement of the fingers, and that fabrication-induced stresses can result in cracks in the polysilicon film resulting in poor fabrication yield. As a result of these difficulties, nearly all of the 2 billion microphones produced each year employ parallel plate electrodes to achieve capacitive sensing.

Another example of a pivoting planar microstructure MEMS device technology is a so-called micromirror, which is an actuator driven device [14-18]. It is important that these devices be able to move as quickly as possible (thus implying maintaining a low inertia), and in many designs, they are designed to rotate about a hinge axis in a similar manner to the concept shown in FIGS. 1A and 1B. Reducing the inertia along with the stiffness of the supporting hinge also reduces the voltage (and power) needed for capacitive actuation. These systems are thus subject to the same stress concentration at the pivot as the concept of FIGS. 1A and 1B.

In an interdigitated electrode finger structure, a series of N fingers having length 1 extend in the plane of the diaphragm into a corresponding set of fingers held in fixed position, overlapping by a distance h and separated by a gap d. The diaphragm is free to move normal to its plane in the x direction, and thus the respective sets of fingers have a displacement related to the amount of movement. It is noted that the capacitance of the structures is generally the sum of the respective capacitances of the fingers, and therefore if there is variation, the individual values may be calculated and summed. The total capacitance C of a microphone structure using the interdigitation technique may therefore be roughly estimated by:

$$C = \frac{\varepsilon(h-x)}{d}l2N$$

If a bias voltage Vb is then applied between diaphragm and back plate, for example to permit sensing of the displacement, the resulting electrostatic force f (for small x, neglecting fringing effects) will be:

$$f = \frac{d}{dx}\left(\frac{1}{2}\frac{\varepsilon(h-x)}{d}l2NV_b^2\right) = -\frac{\varepsilon}{d}lNV_b^2$$

The bias voltage Vb does not reduce the stability of the diaphragm's motion in the x direction; a high bias voltage Vb may be used without a need to increase diaphragm stiffness, resulting in increased microphone sensitivity (for equal capacitance) without the diaphragm collapse problems. The applied static voltage results in an attractive force that acts to bring the moving sensing electrode toward the fixed electrode. In the case of the present comb-sense microphone, this attractive force acts to bring the microphone diaphragm toward its neutral position (i.e., x=0), in line with the fixed fingers. As a result, the bias voltage tends to stabilize the diaphragm rather than lead to instability. As long as the fingers are designed so that they themselves will resist collapsing toward each other, the diaphragm's compliance does not need to be adjusted to avoid collapse against the fixed electrodes. For example, the interdigital fingers may be provided on opposing sides of the diaphragm structure, so that the forces tending to displace it with respect to the finger gap balance each other. This means that the diaphragm may be designed to be highly compliant and thus very responsive to sound.

The following U.S. patents are expressly incorporated herein in their entirety: U.S. Pat. Nos. 7,041,225; 7,318,349; 7,520,173; 7,724,417; 7,808,640; 7,825,484; 7,903,835; 8,129,803; 8,165,323; 7,542,580; 6,963,653; 7,471,798; 7,545,945; 7,826,629; 7,992,283; 8,073,167; 7,146,016; 7,146,014; and 6,788,796.

SUMMARY AND OBJECTS OF THE INVENTION

The present technology provides an improved method of incorporating capacitive actuation and/or sensing in a microstructure that is intended to undergo rotational out of plane motions, as is used in sensors for sound or motion as well as micromirrors and oscillators. Likewise, coupled systems may include both actuation and sensing.

A particular problem with creating a light-weight structure that is intended to rotate rapidly out of plane, is that the point or axis about which it rotates will comprise a stress concentration, which can adversely affect fabrication yield. This problem is addressed, by designing and creating a method of fabricating interdigitated comb-fin structures that serve the dual purpose of protecting the highly compliant rotational axis from fabrication-induced stresses while providing a highly effective mechanism for linear capacitive actuation and sensing.

A particular feature of various embodiments is an exploitation of the potential for high depth aspect ratios in micromachined structures. The technology enables the construction of lighter-weight (and hence rapidly movable) rotational structures than are possible with existing micromachining technology that meets the same performance criteria. The fabrication of these devices typically requires the deposition of a structural film (such as polycrystalline silicon) onto a sacrificial film (such as thermal silicon oxide). The present technology generally eliminates the structural stress (and associated fracture failures) of the structural film that arise both prior to and during the removal of the sacrificial layer. This problem has hampered the creation and manufacture of a number of important microdevices.

The present technology therefore provides, according to one embodiment, a micromechanical structure, comprising a substrate having an aperture, a sacrificial oxide layer peripheral to the aperture; and a polysilicon layer overlying the aperture patterned to have (a) a planar portion; (b) a supporting portion connecting the planar portion to a region of the polysilicon layer peripheral to the aperture; (c) a pattern of polysilicon stiffeners extending beneath the planar portion overlying the aperture; and (d) a pattern of polysilicon ribs surrounding the supporting portion, attached near a periphery of the planar portion, the polysilicon ribs extending from the planar portion to a depth beneath the polysilicon stiffeners, and extending laterally beyond an edge of the planar portion. The polysilicon ribs may form a set of fingers which interdigitate with a corresponding set of polysilicon fingers extending from the polysilicon layer peripheral to the aperture, such that when the planar portion moves, e.g., by a flexion or torsion of the supporting portion due to acoustic waves, a relative movement causes one set of fingers to move out of plane with respect to the other set of fingers, and thus define e.g., an interdigitated sensor.

An exemplary application of this technology is the fabrication of a directional microphone having a diaphragm which rocks about a pivot axis, which may be used, e.g., for hearing aid applications. The technology provides improvements in cost, fabrication yield, and reliability of this microphone. Other devices that employ torsional structures or rotating planar microstructures may likewise be designed and fabricated using this technology.

The technology provides an improved method of fabricating microstructures that are intended to undergo rotational out-of-plane motions, as are used in sensors for sound or motion as well as micro-mirrors, microoptoelectronic systems, microfluidic devices, valves, micro-motors, and oscillators, for example. A major problem with creating a light-weight structure that is intended to rotate rapidly out of plane is that the point or axis about which it rotates will concentrate stress, which can adversely affect fabrication yield and lead to eventual device failure.

The present technology provides a method of fabricating interdigitated comb-fin structures that serve the dual purpose of protecting the highly compliant rotational axis from fabrication-induced stresses, while providing a highly effective mechanism for linear capacitive actuation and/or sensing, in particular by providing high depth aspect ratio structures.

The present technology provides a practical method of implementing interdigitated electrodes in devices that deflect out-of-plane. This increases the capacitance, and thus improves the signal. Likewise, the processes and resulting structures reduce stress induced cracks proximate to the hinges.

In any device that utilizes capacitance for either actuation or sensing, the overall system performance is a strong function of the nominal device capacitance and the rate at which the capacitance changes with the primary structure's deflection. In sensors that must detect extremely small motions (such as microphones), one typically desires a device capacitance that is on the order of 1 pF. This is because typical parasitic capacitances (due to bond pads, wiring, and the buffer amplifier input capacitance) often are also on the order of 1 pF. Because of a number of practical design constraints, this amount of source capacitance has been extremely difficult to achieve in practice. In addition, the variation in capacitance with the deflection of the diaphragm can prove to be nonlinear, which adversely affects the performance. While sensors with small source capacitance can be accommodated with careful design of the interface electronics, the performance and overall system cost will improve if the source capacitance is increased.

The capacitance in the gap between the interdigitated fingers is roughly inversely proportional to the distance across the gap and approximately proportional to the depth of the gap. Unfortunately, there are practical limits on how small the distance across the gap can be formed using typical optical lithography. Creating a gap that is smaller than approximately 1 micron can be very difficult using readily available photolithographic tools. It is also difficult to increase the depth of the gap since this typically will be equal to the thickness of the material (polysilicon) used to form the diaphragm skin. Since it is desirable to have the skin be as thin (and as lightweight) as possible, the thickness is typically on the order of one to two microns. The gap is thus roughly as deep as it is wide.

Because the gap between the interdigitated fingers is on the order of one micron deep, a typical initial deflection (due to static stresses occurring during fabrication) that is greater than one or two microns can result in a significant loss of capacitance, and hence, a reduction in sensitivity. The sensitivity of a fabricated structure can thus be very dependent on the initial static deflection.

The present technology provides a new fabrication process that makes it practical to create interdigitated electrodes having substantially greater capacitance than has previously been achievable in thin diaphragm structures. The signal from the resulting electrodes is also predicted to vary in a much more linear manner with the deflection of the planar diaphragm than is found in conventional interdigitated fingers.

It is therefore an object of this technology is to provide a micromechanical structure, comprising: a substrate having a through hole; a residual portion of a sacrificial oxide layer peripheral to the through hole formed on the substrate; and a polysilicon layer overlying the through hole, patterned to have: a planar portion; at least one supporting portion connecting the planar portion to a portion of the polysilicon layer on the residual portion of the sacrificial oxide layer peripheral to the through hole; a first pattern of polysilicon stiffeners formed extending beneath the planar portion overlying the through hole, configured to stiffen the planar portion; and a second pattern of polysilicon ribs selectively disposed surrounding the at least one supporting portion, attached near a periphery of the planar portion, wherein the polysilicon ribs extend from the planar portion to a depth beyond a depth of the polysilicon stiffeners, and extend laterally beyond an edge of the planar portion.

At least a portion of the first pattern of polysilicon stiffeners may be configured as a set of fingers which interdigitate with a corresponding set of fingers, formed of polysilicon, extending from a portion of the polysilicon layer on the residual portion of the sacrificial oxide layer peripheral to the hole, wherein the planar portion is configured to move, by a flexion or torsion of the at least one supporting portion, to thereby cause a relative movement of the set of fingers with respect to the corresponding set of fingers out of a plane of the planar portion. The set of fingers and the corresponding set of fingers may be conductive and electrically isolated, and are configured to act as a capacitive displacement sensor.

The planar portion may move in response to acoustic vibrations. The planar portion may be configured to rotate in response to acoustic vibrations.

The planar portion may be supported by a pair of opposed supporting portions, and be configured to rotate in response to acoustic vibrations about an axis defined by the pair of opposed supporting portions.

The planar portion may comprise a diaphragm of a directional microphone.

The polysilicon ribs may have a height at least 10 times a thickness of the planar portion.

The polysilicon stiffeners may intersect the polysilicon ribs.

Another object provides a method of forming a micromechanical structure, comprising: etching at least one trench into a substrate in a first etch; forming a sacrificial layer on the substrate and walls of the at least one trench; depositing a structural layer over the sacrificial layer, extending into the at least one trench; etching a boundary of a structure formed from the structural layer, wherein at least a portion of the structural layer overlying portions of the at least one trench is removed in a second etch; etching a void through the substrate from beneath the structure in a rear etch; and removing at least a portion of the sacrificial layer, to preserve a portion of the structural layer separated from the substrate by a fluid space, wherein at least a portion of the sacrificial layer on the walls of the at least one trench is removed subsequent to removal of a portion of the sacrificial layer on the substrate.

The portion of the structural layer separated from the substrate by a fluid space may be flexibly supported by a narrow portion of the structural layer, and the at least one trench may be formed proximate to the narrow portion, the sacrificial layer underlying the narrow portion being removed before the sacrificial layer on the walls of the at least one trench, such that the narrow portion remains held in position by the structural layer which extends into the at least one trench while the sacrificial layer underlying the structural layer in regions absent the at least one trench is removed before the sacrificial layer adjacent to the structural layer which extends into the at least one trench, the removing of the sacrificial layer proceeding until the structural layer which extends into the at least one trench is free to move into and out of the trench by a flexion of the narrow portion.

The substrate may comprise silicon, and the sacrificial layer may comprise silicon dioxide formed by oxidizing a surface of the silicon substrate. The sacrificial layer may be removed by dissolution of the silicon dioxide sacrificial layer in hydrofluoric acid.

The at least one trench may comprise at least two trenches, having different depths, wherein the deeper trench is formed proximate to the narrow portion, to thereby support the narrow portion while the sacrificial layer on the walls of the shallower trench is removed.

The at least one trench may be formed by reactive ion etching. The second etch may also comprise reactive ion etching. The rear etch may comprise a through-wafer, deep reactive ion etch.

The at least one trench may be provided as a pair of linear arrays of trenches to define a set of interdigitated fingers. The second etch may free a portion of the set of interdigitated fingers attached within the boundary to the structure to move with respect to a portion of the set of interdigitated fingers detached from the structure. The interdigitated fingers may be conductive, thus forming a capacitive displacement sensor. The interdigitated fingers may have a depth greater than about ten times a thickness of the structural layer. The interdigitated fingers may overly the void, and at least a portion of the set of interdigitated fingers may be free to move toward and away from the void.

The sacrificial layer may be formed by chemically converting the substrate to another composition, wherein the set of interdigitated fingers is defined by trenches formed sufficiently close, and conversion is conducted to completely convert a wall between adjacent trenches to the other composition.

The sacrificial layer may keep the structure from being fully released after the rear etch.

The structure may comprise a diaphragm of a microphone, which displaces in response to acoustic vibrations. The diaphragm may pivot about a pair of narrow portions. The diaphragm may further symmetrically pivot about the pair of narrow portions, to provide a directional acoustic response.

The at least one trench may comprise a first set of trenches which define a set of stiffeners configured to stiffen the structure, and a second set of trenches, deeper than the first set of trenches, configured to define supports for the structure which are released from the substrate by removal of the sacrificial layer after the stiffeners are released from the substrate. Respective ones of the first set of trenches may intersect ones of the second set of trenches.

The method may further comprise defining third and fourth sets of trenches, configured to together form a set of interdigitated fingers, the third set of trenches defining a first set of fingers attached to the substrate, and the fourth set of trenches defining a second set of fingers attached to the structure and interleaved with the first set of fingers, and moveable with the structure with respect to the substrate. The second set of trenches may be deeper than the first set of trenches.

The sacrificial layer may serve as an etch stop which limits an extent of the rear etch.

A surface of the structure may remain fixed to the substrate through the sacrificial layer until the removing is conducted. The structural layer may comprise polysilicon, which covers the substrate and fills the at least one trench.

A plurality of structures may be formed on the substrate, the method further comprising separating a plurality of dice each containing at least one structure prior to said removing.

The method may further comprise rinsing the substrate after said removing, and then drying the substrate in a critical point drier to avoid stiction.

It is understood that the deep trenches support the fragile portion during processing, and are freed as a late step in fabrication, avoid stress on the fragile portion, and may be used in various MEMS systems. The fragile portion may be used in flexion or torsion, and may be a supporting element, actuator, sensor, or the like. In general, it is desirable to free the protective structure from the substrate by removing the sacrificial layer which holds it in place; however, some devices do not require complete removal, and therefore a partial removal may be used, retaining a portion of the sacrificial oxide deep in the trench, for example, in regions of the substrate not aligned with the rear through hole.

BRIEF DESCRIPTION OF THE FIGURES

The invention will now be explained by way of example, in which:

FIGS. 3A-3F show a fabrication process according to the prior art for microphone diaphragm shown in FIGS. 1A, 1B, and 2, with interdigitated comb fingers at the perimeter of the diaphragm, in which:

FIG. 3A shows deep reactive ion etching (RIE);
FIG. 3B shows thermal oxide growth;
FIG. 3C shows polysilicon deposition;
FIG. 3D shows polysilicon smoothing and RIE to define diaphragm and comb fingers;
FIG. 3E shows backside RIE; and
FIG. 3F shows buffered hydrofluoric acid etching to remove the thermal oxide.

FIGS. 6A-6F show a fabrication process for interdigitated comb fins according to the present invention, in which stiffeners can be incorporated through the use of a separate trench etch as in the initial step, in which:

FIG. 6A shows trench etching;
FIG. 6B shows trench oxidation;
FIG. 6C shows polysilicon deposition;
FIG. 6D shows polysilicon patterning;
FIG. 6E shows backside etching; and
FIG. 6F shows buffered hydrofluoric acid release.

FIG. 8B is an intermediate stage.

DESCRIPTION OF THE INVENTION

Figure 3G:
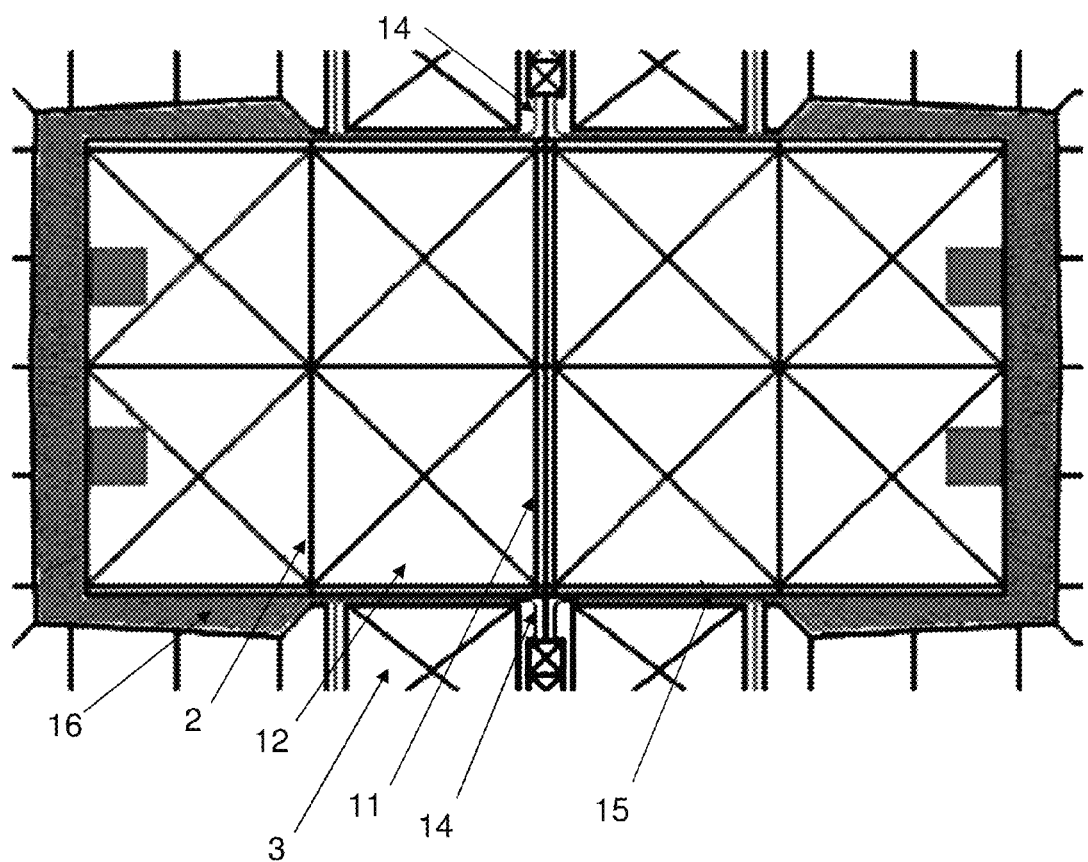
FIG. 3G shows an L-Edit image of the prior art silicon differential microphone diaphragm shown in FIGS. 1A, 1B, and 2 with comb fingers, slits that define the diaphragm and the comb fingers, and stiffeners that reinforce the diaphragm.

According to one embodiment of the technology, a 1 mm×2 mm microphone diaphragm is made of polysilicon and has stiffeners and carefully designed hinge supports to ensure that it responds like a rigid body on flexible hinges. Larger microphone diaphragms, e.g., 1 mm×3 mm are also possible. The diaphragm is designed to respond to pressure gradients, e.g., due to acoustic waves in air, giving it a first-order directional response to incident sound. Both the diaphragm and stiffening ribs are made of LPCVD (low pressure chemical vapor deposition) polysilicon. The diaphragm is about 2 μm thick and the stiffening ribs are 4 μm wide and 40 μm tall. This structure provides a highly compliant differential microphone that responds to the differences in pressure on the two sides of the diaphragm that are separated by the hinges at the center [4, 20-22]. Interdigitated fingers, which consist of 100 μm long, 1.5 μm wide fingers with 6 μm periodicity, are incorporated at the perimeter of the two ends of the diaphragm, the locations with maximum deflection. FIG. 3G shows the L-Edit image for the microphone diaphragm with interdigitated comb sense fingers.

Figure 1A:
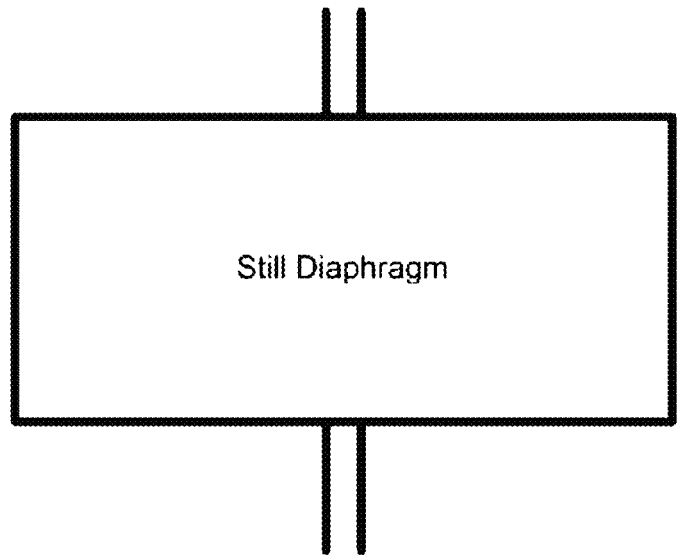
FIGS. 1A and 1B show a top view of a diaphragm, and cross section view of a prior art planar microstructure that is supported on flexible hinges; the structure is fabricated on a silicon chip that supports the hinges, and the diaphragm is separated from the surrounding substrate by etching a slit around the perimeter while leaving the connection at the hinges intact.
Figure 1B:
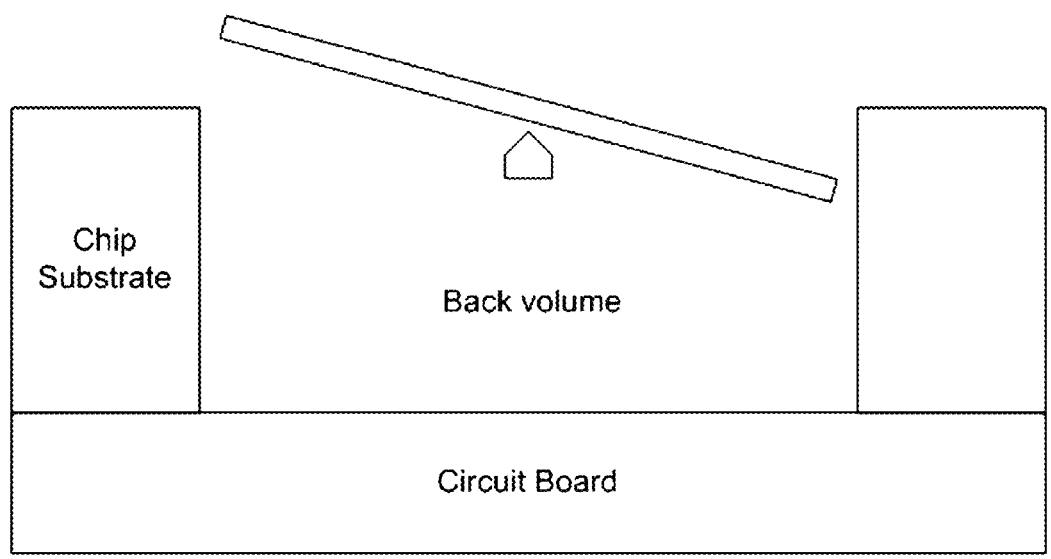

FIGS. 1A and 1B show a planar microstructure diaphragm 12 that is supported on flexible hinges 14. The structure is fabricated on a silicon chip that supports the hinges 14. The diaphragm 12 is separated from the surrounding silicon substrate 3 by etching a slit 15 around the perimeter while leaving the connection at the hinges 14 intact. The diaphragm 12 is intended to rotate like a rigid body without bending, so that its motion is dominated by rotation about its central axis 11. In applications where the rotation of the structure is intended to occur rapidly, it is essential that the mass moment of inertia about the pivot axis be as small as possible. To achieve the stiff diaphragm 12, stiffeners 2 may be provided on a thin membrane, to maintain its rigid body motion.

Figure 2:
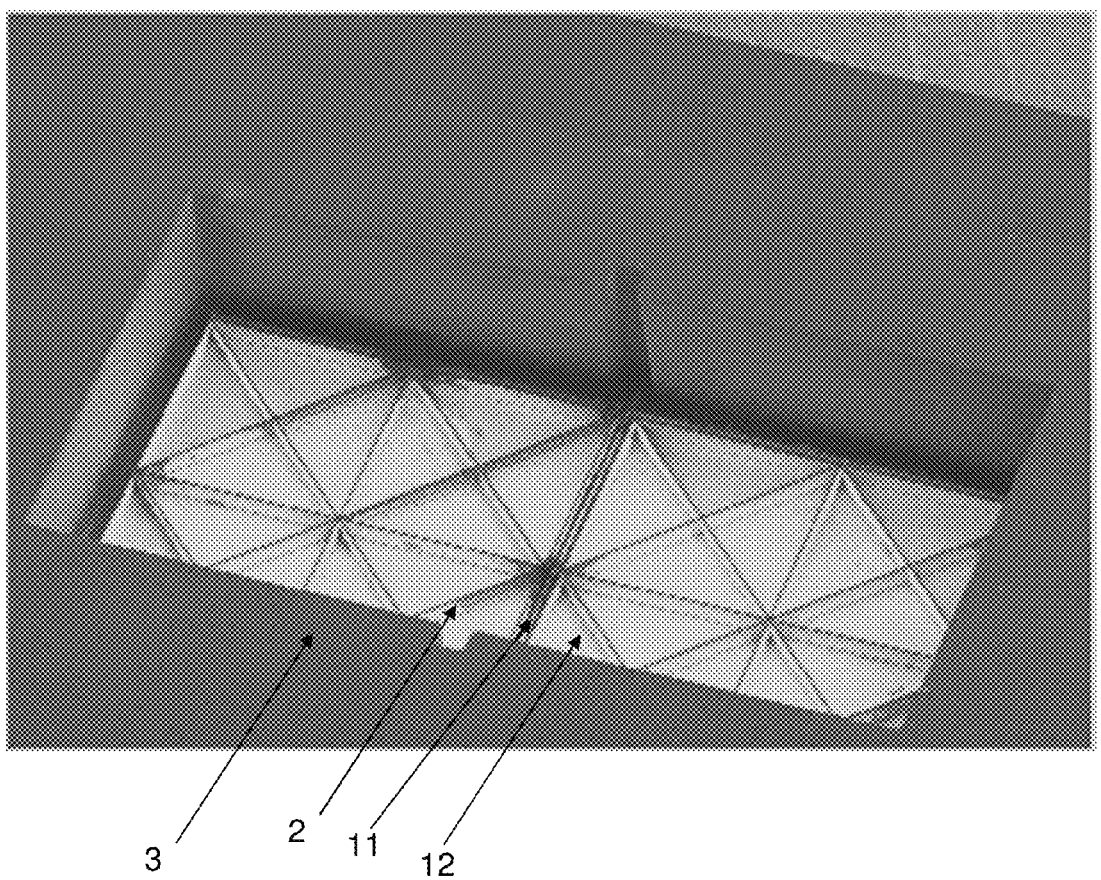
FIG. 2 shows the stiffened diaphragm of FIGS. 1A and 1B, as seen through the hole in the backside of the chip.

FIG. 2 shows a stiffened diaphragm 12, as seen from the backside, through the backside hole below the diaphragm 12. This structure's motion is dominated by the rocking motion about the central hinge axis 11 as in the concept of FIGS. 1A and 1B [7]. FIG. 2 does not show the slit that surrounds the diaphragm at all locations other than at the pivots.

The stiffeners 2 shown in FIG. 2 are formed using the same polysilicon material that is used to make the planar portion (the skin) of the diaphragm 12. The diaphragm 12 shown in FIG. 2 is 2 mm long and 1 mm wide. The stiffeners 2 are 30 microns tall and 2 microns wide. The skin of the diaphragm is approximately 1.5 microns thick. The substrate chip is 500 microns thick, which is also the depth of the rectangular hole shown in FIG. 2. The planar microstructure is created by processing silicon wafers 3 using the tools commonly employed in silicon microfabrication.

FIGS. 3A-3F show a cross section view of the fabrication process flow for manufacturing a prior art microphone diaphragm 12. The process begins in step 1 shown in FIG. 3A, with a deep reactive ion etch of a bare silicon wafer 3 to create trenches 6 that are approximately 3 microns wide and 30 microns deep that act as the mold for the polysilicon stiffeners 10.

This is followed, in step 2 shown in FIG. 3B, by a wet oxidation at 1100 degrees Celsius to grow a one-micron thick thermal oxide layer 4 on the wafer surface and in the trenches 6. This oxide is used as an etch stop for a subsequent backside cavity etch shown in FIG. 3E.

The phosphorus-doped polysilicon is then deposited onto the thermal oxide 4 at 580 degrees Celsius through low-pressure chemical vapor deposition (LPCVD) and subsequently annealed to form polycrystalline silicon 5 at 1100 degrees Celsius in argon gas for 60 minutes in order to reduce intrinsic stress in the film in step 3 shown in FIG. 3C.

The next step 4 shown in FIG. 3D planarizes the annealed polysilicon to form a flat diaphragm surface 8 having stiffeners 10, followed by reactive ion etching to define the interdigitated comb sense fingers 16 and slits 7 that separate the diaphragm 12 from the substrate 3 around the perimeter of the diaphragm 12 so that it will eventually be supported only on the flexible hinges 14 (shown in top view FIG. 3G).

A through-wafer, deep reactive ion etch of the back cavity is then performed in step 5 shown in FIG. 3E, to free the back side of the diaphragm 12. This etch stops on the thermal oxide layer 4 film grown in step 2 shown in FIG. 3B.

Finally, the diaphragm 12 is released in step 6 shown in FIG. 3F, using buffered hydrofluoric acid to remove the exposed portion of the thermal oxide layer 4.

Figure 5:
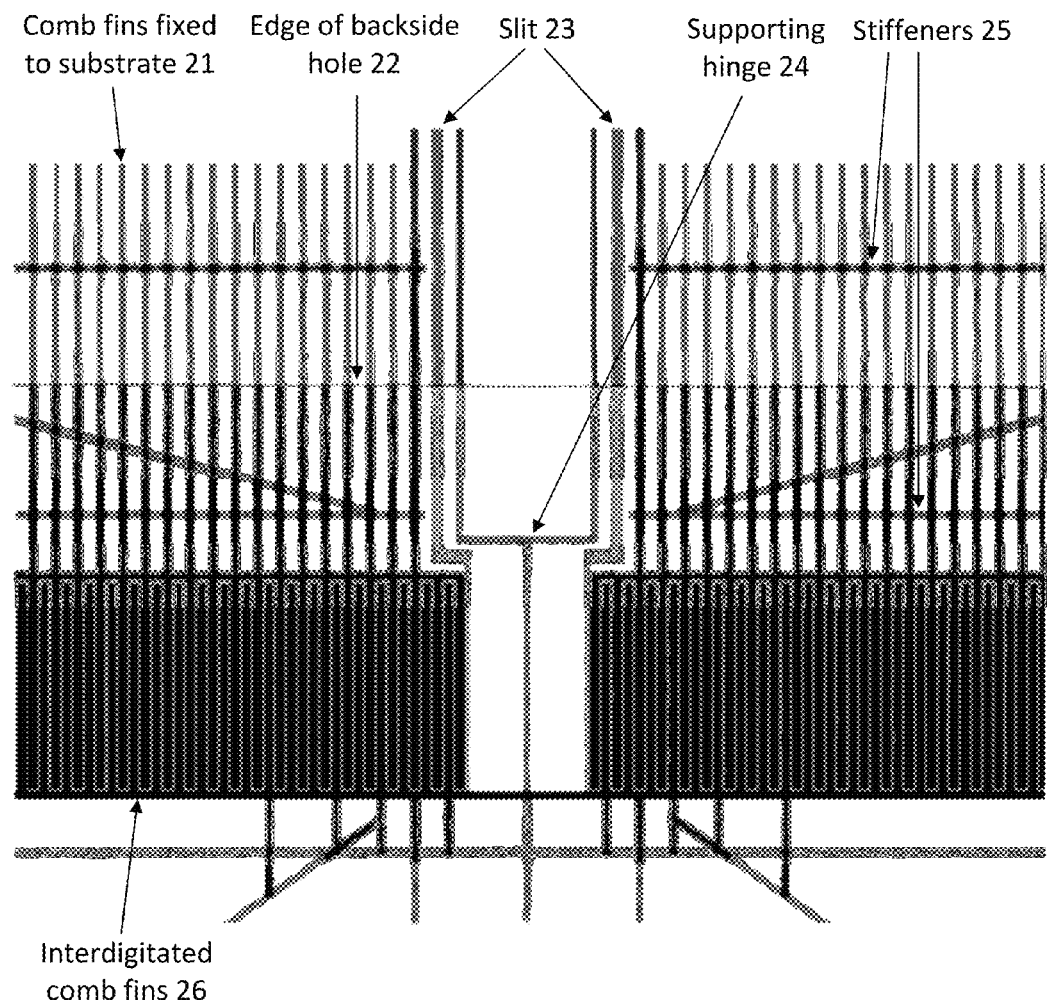
FIG. 5 shows a mask design (showing only the region near the supporting hinge) of comb fins to protect the supporting hinge according to the present invention.
Figure 7:
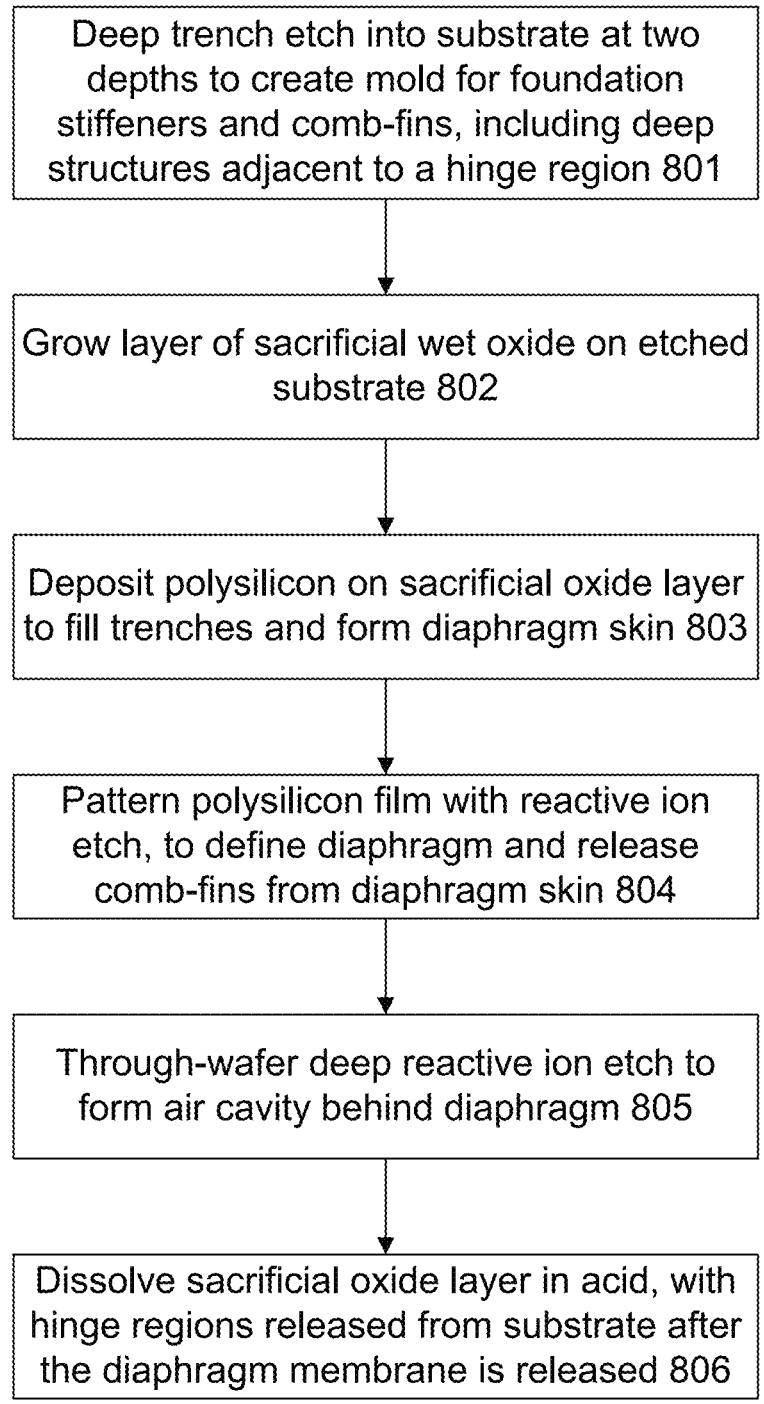
FIG. 7 shows a flowchart of the fabrication process according to FIG. 6.

The process of FIGS. 3A-3F schematically show a practical method to create light-weight, yet stiff planar structures that are supported on flexible hinges. To create a device that can be actuated (such as a mirror) or to create a sensor (such as a motion detector or microphone), one may incorporate capacitive electrodes into the fabrication process of FIGS. 3A-3F. This could be accomplished either by constructing parallel plate-type capacitive electrodes at either end of the diaphragm or by modifying the slit etch to construct interdigitated fingers at the ends as shown in FIG. 5. The biologically-inspired microphone with interdigitated comb sense fingers 16, see e.g., U.S. Pat. No. 7,545,945 and U.S. Pat. No. 8,073,167, expressly incorporated herein by reference, is fabricated on a silicon substrate using a combination of surface and bulk micromachining techniques. This fabrication technique uses deep-trench etching and sidewall deposition to create very lightweight, very stiff membranes with stiffening ribs at optimal locations.

Figure 4:
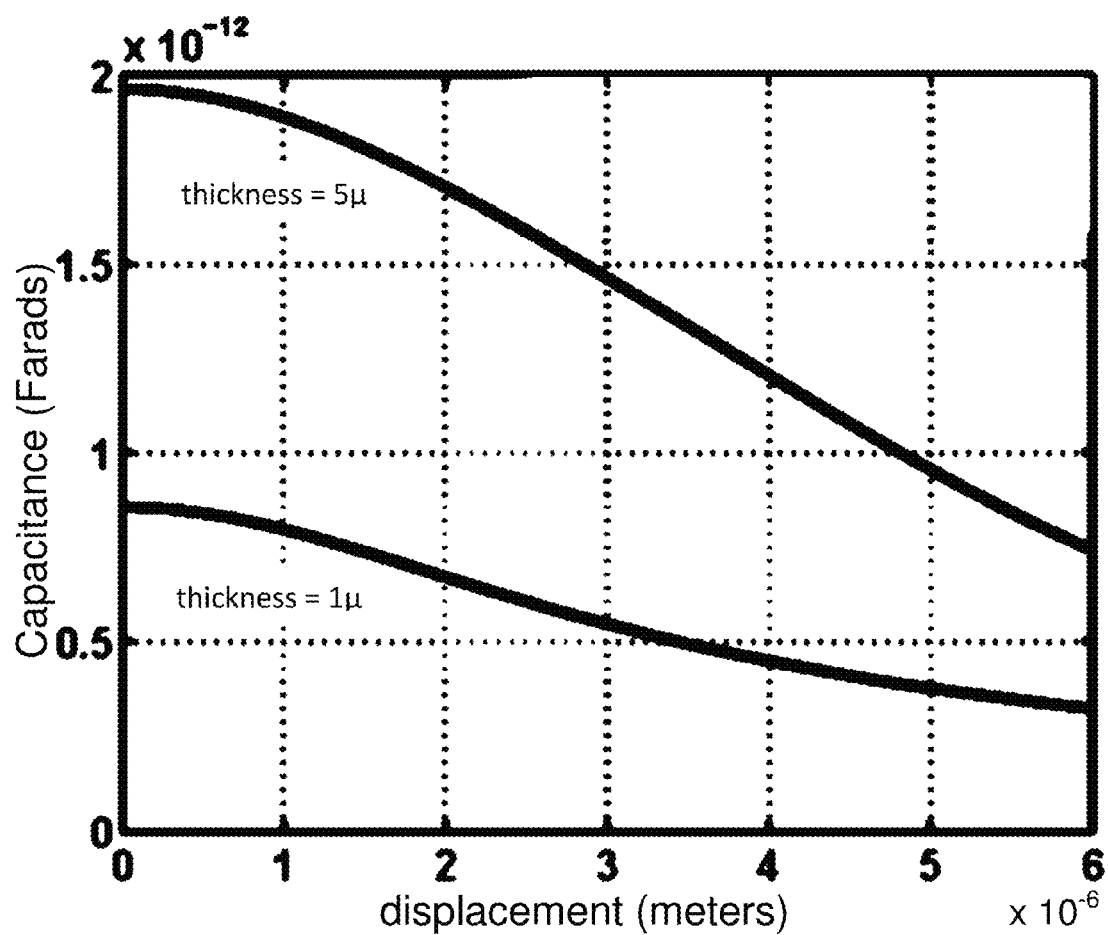
FIG. 4 shows a predicted capacitance of a diaphragm according to the present invention, as a function of the out of plane displacement of the planar diaphragm, for electrodes having thickness of one or five microns.

An analytical model predicts the capacitance of these interdigitated electrodes as a function of the out of plane displacement of the planar diaphragm, as shown in FIG. 4. This technology enables the creation of electrodes having thickness on the order of five to ten microns, leading to substantial improvements in performance as shown. The fabrication process enables fabrication of interdigitated fingers having substantially larger thickness (in the direction normal to the plane of the diaphragm) than has been practical previously. Rather than constructing fingers having a thickness that is equal to that of the diaphragm skin (on the order of one micron), this process allows construction of interdigitated fins having a thickness on the order of five to ten microns. This results in a dramatic increase in capacitance as shown in FIG. 4. In addition, the predicted capacitance is seen to vary much more linearly with the diaphragm deflection with this increased electrode thickness.

The results shown in FIG. 4 are for a device having dimensions that are appropriate for a MEMS microphone, and indicate that the nominal sensor capacitance is increased significantly by the use of five micron thick electrodes rather than one micron electrodes. The source capacitance is greater than the target minimum value of 1 pF, and is seen to vary linearly with the diaphragm deflection for a wide range of displacement.

While the fabrication process exemplified in FIGS. 3A-3F easily permits the incorporation of interdigitated fingers, the resulting diaphragms can be subject to stress-induced fracture during the final release etch depicted in FIG. 3F. The diaphragm material is subjected to substantial stresses after completion of the back side deep reactive ion etch (FIG. 3E) because the sacrificial thermal oxide layer 4 typically has approximately 350 MPa of compressive stress relative to that of the bulk silicon wafer 3. This is in contrast to the polysilicon that comprises the diaphragm 12 which has approximately 50 MPa of stress (either compressive or tensile, depending on the anneal process, etc.). This substantial compressive stress on such a thin diaphragm 12 results in substantial deflection, typically in the negative direction (toward the back side hole). As the wet etch release of FIG. 3F commences, portions of the slit 7 may be released while sacrificial thermal oxide layer 4 remains over much of the diaphragm 12 surface, resulting in even greater deflections of the diaphragm 12. This can result in excessive deformations and stresses at the hinge 14 support, which can produce cracks in this critical element of the system.

The present technology creates interdigitated electrodes having significantly increased thickness (i.e., depth into the plane of the structure) which causes the electrodes to also have substantially increased bending stiffness, that resist flexure of the diaphragm during the fabrication process. The interdigitated electrodes are separated by sacrificial oxide having a thickness of approximately one micron. During the release process, this oxide is likely to remain longer than that on the planar portions of the diaphragm. This is because the oxide that separates the electrodes is contained within a space that is approximately five microns deep, one micron wide and having a length equal to that of the electrodes (typically 50 to 100 microns). The wet etch process will require considerably longer to remove this buried material than that which is covering the plane surface of the diaphragm. The electrodes will thus resist flexure (and the associated damaging stresses and strains) that occur around the perimeter of the diaphragm. If the electrodes are also utilized in the vicinity of the delicate hinge support, they would provide considerable protection from the oxide compressive stress.

The thickened interdigitated electrodes may be configured to provide a substantial increase in resistance to flexure in the vicinity of the diaphragm's hinge support. It is believed that this increased stiffness will provide sufficient protection to prevent cracks in the hinge and diaphragm during the wet release.

The technology provides a method for creating interdigitated fins that provide the dual benefits of substantially increased capacitance over what can be achieved with interdigitated fingers which are limited to the thickness of the diaphragm (itself limited in thickness due to mass issues), and a reduction in structural stress during the critical steps in the fabrication process. These benefits may be achieved together or independently, and thus the thick interdigitated fins do not require protection of a hinge structure, and a protected hinge structure does not also require thick fins. The fins essentially combine the structural functions of the stiffeners and the capacitive functions of the fingers, described above. This process enables the practical construction of interdigitated electrodes having a depth that can be substantially greater than the thickness of the diaphragm skin. For example, a fin depth can be 5 to 10 microns, rather than the approximately one micron depth of the skin. Since the bending stiffness of the fins is proportional to the cube of the depth, this structure provides a dramatic increase in resistance to flexure, which serves to protect the supporting hinge during the release process. In addition, the increased depth of the interdigitated electrodes provides an increase in capacitance as shown in FIG. 4.

FIG. 5 shows a plan view of a mask design the interdigitated fins 26 near the supporting hinge 24 of the diaphragm, which serve to protect the supporting hinge 24. The fins 21 are fixed to the substrate and the planar sheet on each side, and form an interdigitated comb fin 26 structure where they approach one another, the slit 23 etch is immediately lateral on each side of the supporting hinge 24, and define the lateral edges of a torsional bridge between the substrate and planar sheet, and the stiffeners 25 extend perpendicular or diagonal to the comb fins 21, as well as being provided parallel to the comb fins 21 adjacent to the slit 23 etch. FIG. 5 shows only the region near the supporting hinge. The supporting hinge 24 in this case consists of a stiffener that spans the entire width of the approximately rectangular structure and terminates in the bulk silicon comprising the substrate. FIG. 5 shows interdigitated fins 26 in the vicinity of the hinge 24 but they may also be incorporated around the entire diaphragm perimeter. The fins that are adjacent to the hinge 24 are primarily employed to protect the hinge 24 during fabrication; the limited motion of the diaphragm near the hinge 24 causes these nearby electrodes to have minimal use for sensing or actuation.

The fabrication process to create the interdigitated comb fins is shown in FIGS. 6A-6F and FIG. 7. Note that stiffeners can be incorporated through the use of a separate trench etch, as in step 801 of FIG. 7. FIGS. 6A-6F show cross section views of the wafer at the interdigitated fins, i.e., beyond the edge of the surface of the diaphragm. A plan view is provided in FIG. 5, which shows that the trenches 6 used to create the fins 26 have separate terminations for fins that move with the diaphragm and for those that are fixed to the surrounding substrate.

The fabrication starts in step 801, with a deep trench etch (FIG. 6A) into the silicon wafer to create a mold (trench 6) for the diaphragm 33 and foundation stiffeners having a first depth 39 from a first etch, and for the two sets of comb-fins having a shallower second depth 37 from a second etch. See FIG. 8C. The ends of the fin trenches intersect with the stiffener-trenches. According to alternate embodiments, the first etch may be the same or deeper than the second etch. In like manner, various structures may be formed at different, independently controlled depths to form a complex structure.

Figure 8A:
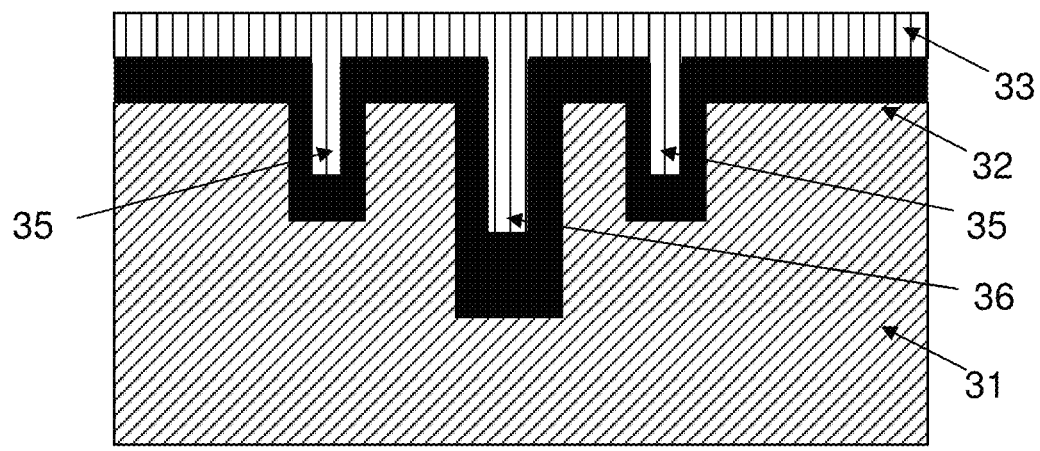
FIGS. 8A-8C show cross section views of micromechanical device during fabrication in which FIG. 8A corresponds to the stage represented in FIG. 6E, FIG. 8C corresponds to the stage represented in FIG. 6F.
Figure 8B:
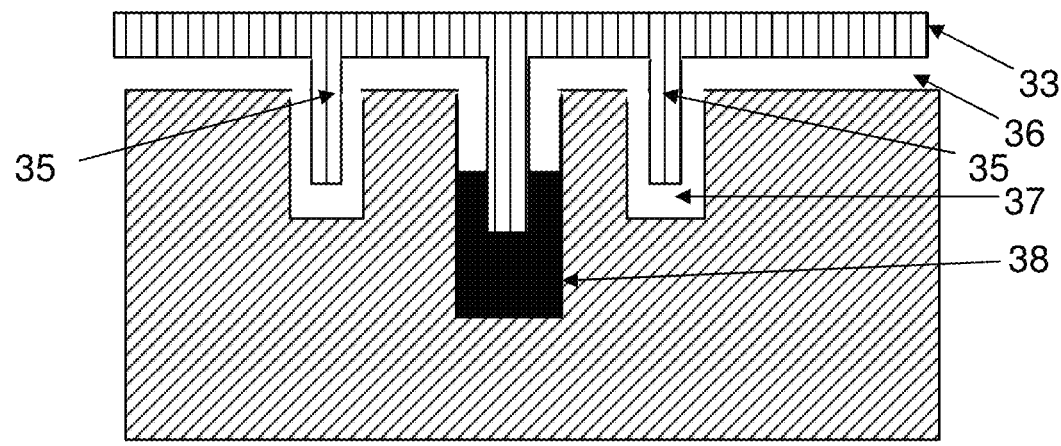

A layer of sacrificial wet oxide 4 (FIG. 6B) is grown in step 802 to form an etch stop for the backside cavity etch (See FIG. 6E), and to form the gap between the fixed comb-fins and moving comb-fins. The oxide layer 4 should be thick enough such that the bulk silicon between the trenches 6 for the two sets of comb-fins is completely oxidized (as shown in FIG. 6B). The oxide layer 4 also keeps the fragile diaphragm 33 from being fully released following the backside cavity etches, as shown in FIG. 8B. The oxide 4 will hold the diaphragm 33 firmly in place until it is etched away from between the fins 35 during the final step, as shown in FIG. 8B, and thus serves to avoid stress and curling.

The polysilicon is deposited in step 803 (FIG. 6C), such that the deposited polysilicon 5 fills the trenches 6 that will become the supporting stiffeners 36 and the comb-fins 35. The polysilicon 5 on the surface of the wafer will form the diaphragm 33 'skin'.

The polysilicon film 5 is then patterned (FIG. 6D) in step 804, with a reactive ion etch, to separate the diaphragm 33 from the foundation 31 and remove the polysilicon layer 5 above the two sets of comb-fins 35 so that they can be displaced in and out of the plane of the diaphragm 33.

Step 805 consists of a through-wafer, deep reactive ion etch on the backside (FIG. 6E), to create a cavity 9 that defines the air chamber behind the diaphragm 33. The wafer may be diced into chips, to provide separate microphones, or maintained as an integral substrate for a microphone array.

Figure 8C:
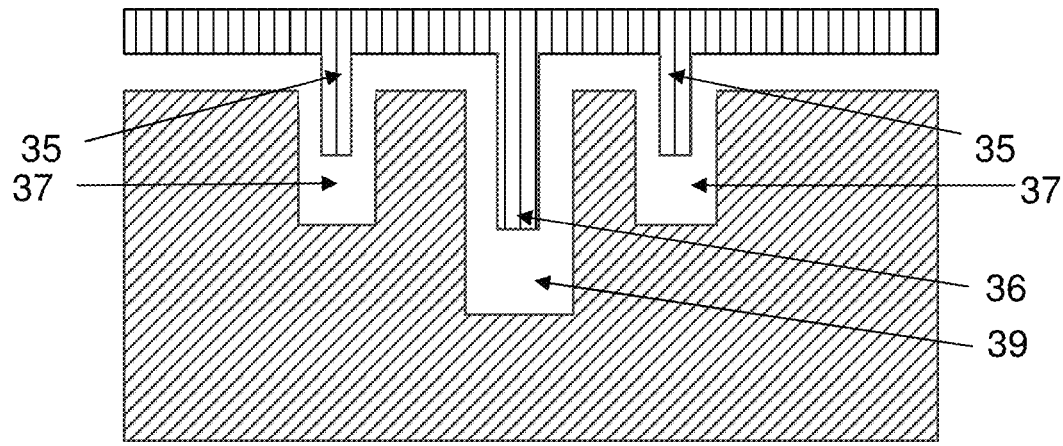

Step 806 provides the final release, achieved by dissolving the sacrificial oxide layer 4 in buffered hydrofluoric acid (FIG. 6F, FIGS. 8B and 8C). The structures are rinsed, and placed in a critical point drier (to avoid stiction).

In this description, several preferred embodiments were discussed. It is understood that this broad invention is not limited to the embodiments discussed herein, but rather is composed of the various combinations, subcombinations and permutations thereof of the elements disclosed herein. The invention is limited only by the following claims.

REFERENCES (The entirety of the below references are each expressly incorporated by reference in their entirety)

1. K. Yoo, C. Gibbons, Q. Su, R. Miles, and N. Tien, "Fabrication of biomimetic 3-D structured diaphragms", Sensors and Actuators A-Physical 97-8, 448-456 (2002), Transducers 2001 Conference/Eurosensor $XV^{th}$ Conference, Munich, Germany, Jun. 10-14, 2001.

2. L. Tan, R. Miles, M. Weinstein, R. Miller, Q. Su, W. Cui, and J. Gao, "Response of a biologically inspired NMMS differential microphone diaphragm", in Unattended Ground Sensor Technologies and Applications IV, edited by Carapezza, E M, volume 4743 of Proceedings of the Society of Photo-Optical Instrumentation Engineers (SPIE), 91-98 (2002), Conference on Unattended Ground Sensor Technologies and Applications IV, Orlando, Fla., Apr. 2-5, 2002.

3. R. Miles and R. Hoy, "The development of a biologically-inspired directional microphone for hearing aids", Audiology and Neuro-Otology 11, 86-94 (2006).

4. W. Cui, B. Bicen, N. Hall, S. Jones, F. Degertekin, and R. Miles, "Optical sensing in a directional MEMS microphone inspired by the ears of the parasitoid fly, Ormia ochracea", in MEMS 2006: 19th IEEE International Conference on Micro Electro Mechanical Systems, Technical Digest, Proceedings: IEEE Micro Electro Mechanical Systems Workshop, 614-617 (2006), 19th IEEE International Conference on Micro Electro Mechanical Systems (MEMS 2006), Istanbul, TURKEY, Jan. 22-26, 2006.

5. B. Bicen, S. Jolly, K. Jeelani, C. T. Garcia, N. A. Hall, F. L. Degertekin, Q. Su, W. Cui, and R. N. Miles, "Integrated Optical Displacement Detection and Electrostatic Actuation for Directional Optical Microphones With Micromachined Biomimetic Diaphragms", IEEE Sensors Journal 9, 1933-1941 (2009).

6. W. Cui, R. N. Miles, and Q. Su, "The Design, Fabrication and Characterization Of A Novel Miniature Silicon Microphone Diaphragm", in NANOTECH Conference & Expo 2009, VOL 1, Technical Proceedings-NANOTECHNOLOGY 2009: Fabrication, Particles, Characterization, MEMS, Electronics and Photonics, edited by Laudon, M and Romanowicz, B, 432-435 (2009), Nanotech 2009 Conference, Houston, Tex., May 3-7, 2009.

7. R. N. Miles, Q. Su, W. Cui, M. Shetye, F. L. Degertekin, B. Bicen, C. Garcia, S. Jones, and N. Hall, "A low-noise differential microphone inspired by the ears of the parasitoid fly Ormia ochracea", Journal of the Acoustical Society of America 125, 2013-2026 (2009).

8. R. Miles, S. Sundermurthy, C. Gibbons, R. Hoy, and D. Robert, "Differential microphone", (2004), U.S. Pat. No. 6,788,796.

9. R. Miles, "High-order directional microphone diaphragm", (2005), U.S. Pat. No. 6,963,653.

10. R. Miles, "Comb sense capacitive microphone", (2009), US Patent App. 2009/0262958.

11. R. Miles and F. Degertekin, "Optical sensing in a directional mems microphone", (2010), U.S. Pat. No. 7,826,629.

12. R. Miles and W. Cui, "Robust diaphragm for an acoustic device", (2011), U.S. Pat. No. 7,876,924.

13. R. Miles, "Miniature non-directional microphone", (2011), U.S. Pat. No. 7,903,835.

14. H. Xie, Y. Pan, and G. Fedder, "A CMOS-MEMS minor with curled-hinge comb drives", Microelectromechanical Systems, Journal of 12, 450-457 (2003).

15. A. Ferreira and S. Aphale, "A survey of modeling and control techniques for micro- and nanoelectromechanical systems", Systems, Man, and Cybernetics, Part C: Applications and Reviews, IEEE Transactions on 1-15 (2008).

16. F. Hu, Y. Tang, and Y. Qian, "Design of a mems micromirror actuated by electrostatic repulsive force", Optik-International Journal for Light and Electron Optics (2011).

17. S. Weber, L. Bonacina, W. Noell, D. Kiselev, J. Extermann, F. Jutzi, S. Lani, O. Nenadl, J. Wolf, and N. de Rooij, "Design, simulation, fabrication, packaging, and characterization of a mems-based mirror array for femtosecond pulse-shaping in phase and amplitude", Review of Scientific Instruments 82, 075106 (2011).

18. Y. Ma, S. Islam, and Y. Pan, "Electrostatic torsional micromirror with enhanced tilting angle using active control methods", Mechatronics, IEEE/ASME Transactions on 16, 994-1001 (2011).

19. D. Homentcovschi and R. Miles, "Modeling of viscous damping of perforated planar microstructures. Applications in acoustics", Journal of the Acoustical Society of America 116, 2939-2947 (2004).

20. D. Homentcovschi and R. Miles, "Viscous damping of perforated planar micromechanical structures", Sensors and Actuators A-Physical 119, 544-552 (2005).

21. D. Homentcovschi and R. N. Miles, "Viscous microstructural dampers with aligned holes: Design procedure including the edge correction", Journal of the Acoustical Society of America 122, 1556-1567 (2007).

22. D. Homentcovschi, W. Cui, and R. N. Miles, "Modelling of viscous squeeze-film damping and the edge correction for perforated microstructures having a special pattern of holes", in Proceedings of the ASME International Design Engineering Technical Conference and Information in Engineering Conference, VOL 1, PTS A-C, 1025-1033 (2008), ASME International Design Engineering Technical Conferences/Computers and Information in Engineering Conference, Las Vegas, Nev., Sep. 4-7, 2007.

23. D. Homentcovschi and R. N. Miles, "Analytical model for viscous damping and the spring force for perforated planar microstructures acting at both audible and ultrasonic frequencies", Journal of the Acoustical Society of America 124, 175-181 (2008).

24. W. Cui, R. N. Miles, and D. Homentcovsci, "The effect of shape and distribution of perforations on squeeze-film damping in parallel plate capacitors", in ASME 2009 International Design Engineering Technical Conferences and Computers and Information in Engineering Conference (IDETC/CIE2009), 663-670 (2010), ASME International Design Engineering Technical Conferences/Computers and Information in Engineering Conference, San Diego, Calif., Aug. 30-Sep. 2, 2009.

25. D. Homentcovschi and R. N. Miles, "Viscous damping and spring force in periodic perforated planar microstructures when the Reynolds' equation cannot be applied", Journal of the Acoustical Society of America 127, 1288-1299 (2010).

26. D. Homentcovschi, B. T. Murray, and R. N. Miles, "An analytical formula and FEM simulations for the viscous damping of a periodic perforated MEMS microstructure outside the lubrication approximation", Microfluidics and Nanofluidics 9, 865-879 (2010).

27. Cui, W. (2004). "Analysis, Desgin, and Fabrication of a Novel Silicon Microphone," Ph.D. Thesis, SUNY at Binghampton.

28. V. P. Jaecklin, C. Linder, N. F. de Rooij, and J. M. Moret, Micromechanical comb actuators with low driving voltage, J. Micromech. Microeng. 2 250-255, 1992.

29. Ki Bang Leea and Young-Ho Cho, A triangular electrostatic comb array for micromechanical resonant frequency tuning, Sensors and Actuators A: Physical Volume 70, Issues 1-2, 1 Oct. 1998, Pages 112-117.

30. Analog Devices, "ADXL05, +−1 g to +−5 g Single Chip Accelerometer with Signal Conditioning," Datasheet, 1995, Norwood, Mass. 02062.

31. Arjun Selvakumar, Farrokh Ayazi and Khalil Najafi, A High Sensitivity Z-Axis Torsional Silicon Accelerometer, Journal of Microelectromechanical Systems, June 1998, Volume 7, Issue 2, page(s): 192-200.

32. Rob Legtenberg, A W Groeneveld and M Elwenspoek, Comb-drive actuators for large displacements, J. Micromech. Microeng. 6 320-329, 1996.

33. Yongjun Zhao, Tianhong Cui, Fabrication of high-aspect-ratio polymer-based electrostatic comb drives using the hot embossing technique, 2003 J. Micromech. Microeng. 13 430-435.

34. M. Steven Rodgers, et al., "A New Class of High Force, Low-Voltage, Compliant Actuation Systems," Solid State Sensor and Actuator Workshop, Hilton Head Island, S.C., Jun. 4-8, 2000.

35. Chen Yang-Che, Chang Ian Chao-Min, Rongshun Chen, Hou Max Ti-Kuang, On the side instability of comb-fingers in MEMS electrostatic devices, Sensors and actuators. A, Physical ISSN 0924-4247, vol. 148, no 1, pp. 201-210, 2008.

36. B. Borovic, F. L. Lewis, A. Q. Liu, E. S. Kolesar, D. Popa, The lateral instability problem in electrostatic comb drive actuators: modeling and feedback control Export, Journal of Micromechanics and Microengineering, Vol. 16, No. 7. (July 2006), pp. 1233-1241.

37. Wei Huang, and Ganyu Lu, Analysis of lateral instability of in-plane comb drive MEMS actuators based on a two-dimensional model, Sensors and Actuators A: Physical Volume 113, Issue 1, 15 Jun. 2004, Pages 78-85.

38. Huikai Xie, and Gary K. Feddera, b, Vertical comb-finger capacitive actuation and sensing for CMOS-MEMS, Sensors and Actuators A: Physical Volume 95, Issues 2-3, 1 Jan. 2002, Pages 212-221.

39. Huikai Xie and Gary Fedder, A CMOS z-axis capacitive accelerometer with comb-finger sensing, Proceedings of the 13th IEEE International Conference on Micro Electro Mechanical Systems (MEMS '00), January, 2000, pp. 496-501.

40. Duck-Bong Seo, Robin Shandas, Design and simulation of a MEMS-based come-drive pressure sensor for pediatric post-operative monitoring applications, 2003 Summer Bioengineering Conference, June 25-29, Sonesta Beach Resort in Key Biscayne, Fla.

41. A. Mason, M. Oshinsky, and R. R. Hoy, "Hyperacute directional hearing in a microscale auditory system," Nature, 410, pp. 686-90, 2001.

42. R. N. Miles, D. Robert, and R. R. Hoy, "Mechanically Coupled Ears for Directional Hearing in the Parasitoid Fly *Ormia ochracea*," Journal of the Acoustical Society of America, 98, pp. 3059-3070, 1995.

43. W. Cui, R. N. Miles, Q. Su, "A Robust Miniature Silicon Microphone diaphragm," IFSA, Sensors & Transducers Journal (ISSN 1726-5479), Vol. 7, Special Issue "MEMS: From Micro Devices to Wireless Systems", October 2009, pp. 63-77.

What is claimed is:

1. A method of forming a micromechanical structure, comprising:
    forming a sacrificial layer on a surface of a substrate and walls of at least two trenches formed in the substrate, the at least two trenches having respectively different depths;
    depositing a structural layer over the sacrificial layer, extending into the at least two trenches, the structural layer having a different residual compressive stress than the sacrificial layer;
    selectively etching the structural layer to define a pattern having a boundary, at least a portion of the structural layer overlying a respective portion of the at least one of the at least two trenches being removed and at least a portion of the structural layer extending into the at least one of the at least two trenches being preserved at the boundary; and
    removing the sacrificial layer from underneath the structural layer, and a portion of the sacrificial layer extending into a shallower depth of one of the at least two trenches, prior to removal of the sacrificial layer extending into a deeper depth of one of the at least two trenches at the structural boundary.

2. The method according to claim 1, wherein the pattern having a boundary defines a structural layer plate suspended by the at least a portion of the structural layer extending into the deeper depth of one of the at least two trenches from the substrate.

3. The method according to claim 1, wherein the at least two trenches comprise a set of three trenches, of which a trench having a deeper depth is located between two trenches each having a shallower depth, each of the set of three trenches being removed and at least a portion of the structural layer extending into the set of three trenches being preserved at the boundary.

4. The method according to claim 1, further comprising etching through the substrate to expose a portion of the sacrificial layer underneath a portion of the structural layer, prior to removing the portion of the sacrificial layer from underneath the portion of the structural layer, to expose the portion of the structural layer.

5. The method according to claim 1, wherein the different residual compressive stress causes a flexure of a bilayer comprising the structural layer and the sacrificial layer.

6. The method according to claim 1, wherein the at least a portion of the sacrificial layer extending into the deeper of the at least two trenches at the structural boundary which is removed after at least a portion of the sacrificial layer from underneath the structural layer acts to alleviate a concentration of stress on the at least a portion of the structural layer extending into the shallower of the at least two trenches at the structural boundary prior to completion of removal the at least a portion of the sacrificial layer from underneath the structural layer.

7. The method according to claim 6, wherein the at least a portion of the structural layer extending into the deeper of the at least two trenches at the structural boundary comprises a flexural hinge.

8. The method according to claim 6, wherein the at least a portion of the structural layer extending into the shallower of the at least two trenches at the structural boundary comprises a rib configured to be displaceable along an axis normal to the surface of the substrate.

9. The method according to claim 1, wherein the substrate is a silicon wafer, the sacrificial layer comprises silicon dioxide formed by oxidizing a surface of the silicon wafer, and the structural layer comprises a layer of polysilicon deposited on the sacrificial layer.

10. The method according to claim 1, wherein the at least a portion of the structural layer extending into a plurality of trenches having a common depth at the structural boundary comprise an interdigital transducer.

11. The method according to claim 1, wherein the pattern having a boundary defines a diaphragm of a microphone.

12. The method according to claim 1, wherein the pattern having a boundary defines a micromirror device.

13. A method of forming a micromechanical structure, comprising:
 providing a substrate having a surface and a trench formed into the surface;
 chemically converting an exposed portion of the substrate comprising the surface and the trench formed into the surface to a sacrificial material;
 depositing a layer of structural material over the sacrificial material, wherein the deposited layer of structural material extends into the sacrificial material in the trench;
 patterning the layer of structural material to expose portions of the sacrificial layer, said patterning retaining a portion of the deposited layer of structural material which extends into the sacrificial material in the trench under a removed portion of the structural material;
 etching the substrate to expose a portion of the sacrificial material under the structural material not extending into the trench;
 selectively etching the sacrificial material not extending into the trench before etching at least a portion of the sacrificial material extending in the trench, such that the structural material extending into the trench counters flexure of adjacent layers of the structural material and the sacrificial material, having respectively different residual stresses, and a remaining portion of the sacrificial material the tethers a suspended portion of the structural material over an opening formed in the substrate to a surrounding portion of the substrate,
 wherein the trench comprises at least two trenches, having different depths, the method further comprising removing at least the sacrificial material from a trench having a shallower depth prior to removal of at least a portion of the sacrificial material from a trench having a deeper depth.

14. The method according to claim 13, wherein the at least two trenches comprise a set of three trenches, with a trench having a deeper depth straddled by a pair of trenches having a shallower depth.

15. The method according to claim 13, wherein the structural material extending into a deeper trench of the at least two trenches forms a flexural hinge.

16. The method according to claim 13, wherein the structural material extending into the trench having the shallower depth of the at least two trenches comprises a rib configured to be displaceable along an axis normal to the surface of the substrate into which the respective trench extends.

17. The method according to claim 13, wherein the substrate comprises a silicon wafer, the sacrificial material comprises silicon dioxide formed by oxidizing a surface of the silicon wafer, and the structural material comprises a layer of polysilicon deposited on the sacrificial material.

18. The method according to claim 13, wherein the patterned layer of structural material defines a plate having a set of peripheral interdigital fingers.

19. The method according to claim 18, wherein the patterned layer of structural material defines a microphone diaphragm.

* * * * *